United States Patent
Nishiyama

(10) Patent No.: US 9,530,518 B2
(45) Date of Patent: Dec. 27, 2016

(54) SEMICONDUCTOR DEVICE

(71) Applicant: Renesas Electronics Corporation, Tokyo (JP)

(72) Inventor: Takayuki Nishiyama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/909,962

(22) PCT Filed: Aug. 15, 2013

(86) PCT No.: PCT/JP2013/071956
§ 371 (c)(1),
(2) Date: Feb. 3, 2016

(87) PCT Pub. No.: WO2015/022743
PCT Pub. Date: Feb. 19, 2015

(65) Prior Publication Data
US 2016/0180957 A1    Jun. 23, 2016

(51) Int. Cl.
*G11C 16/26* (2006.01)
*G11C 16/34* (2006.01)
*G11C 16/14* (2006.01)
*G11C 16/04* (2006.01)

(52) U.S. Cl.
CPC ....... *G11C 16/3459* (2013.01); *G11C 16/0408* (2013.01); *G11C 16/14* (2013.01); *G11C 16/26* (2013.01); *G11C 16/3445* (2013.01); *G11C 16/3454* (2013.01)

(58) Field of Classification Search
CPC . G11C 16/26; G11C 16/3459; G11C 16/3454; G11C 16/14
USPC .......... 365/185.21, 185.22, 185.24, 185.29
See application file for complete search history.

(56) References Cited

U.S. PATENT DOCUMENTS

| | | | |
|---|---|---|---|
| 5,784,318 | A | 7/1998 | Anami |
| 2003/0123296 | A1 | 7/2003 | Hirano |
| 2012/0033495 | A1 | 2/2012 | Kato |

FOREIGN PATENT DOCUMENTS

| | | |
|---|---|---|
| JP | H 10-64288 A | 3/1998 |
| JP | H 11-144476 A | 5/1999 |
| JP | 2003-196986 A | 7/2003 |
| JP | 2012-038383 A | 2/2012 |

OTHER PUBLICATIONS

International Search Report (ISR) (PCT Form PCT/ISA/210), in PCT/JP2013/071956, dated Oct. 15, 2013.
Japanese Office Action in Japanese Application No. 2015-531708, dated Oct. 25, 2016 with an English translation thereof.

*Primary Examiner* — Ly D Pham
(74) *Attorney, Agent, or Firm* — McGinn IP Law Group, PLLC

(57) ABSTRACT

A control circuit controls execution of first-stage processing for increasing a threshold voltage of both or one of a first storage element and a second storage element until the threshold voltage of the first storage element and the second storage element attains to a prescribed write verify level when a request for erase of twin cell data is received. The control circuit controls execution of second-stage processing for lowering a threshold voltage of the first storage element and the second storage element until the threshold voltage of the first storage element and the second storage element attains to a prescribed erase verify level after the first-stage processing is performed.

7 Claims, 20 Drawing Sheets

FIG.5
(a)
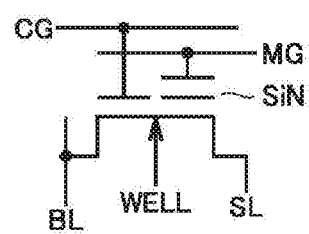
| | BL | CG | MG | SL | WELL | |
|---|---|---|---|---|---|---|
| READ | 1.5V | 1.5V | 0V | 0V | 0V | |
| RAISE Vth | 0V | 1.5V | 10V | 6V | 0V | (FOR EACH BIT) |
| LOWER Vth | Hi-Z | 1.5V | -10V | 6V | 0V | (BATCH) |
(b)
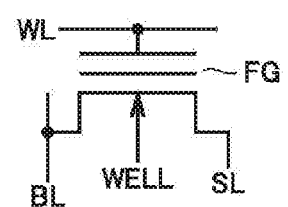
| | BL | WL | SL | WELL | |
|---|---|---|---|---|---|
| READ | 1.5V | 1.5V | 0V | 0V | |
| RAISE Vth | 8V | 10V | 0V | 0V | (FOR EACH BIT) |
| LOWER Vth | 10V | -10V | 10V | 10V | (BATCH) |
(c)
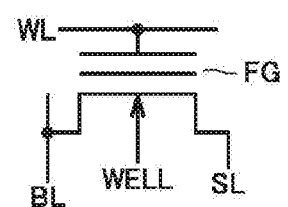
| | BL | WL | SL | WELL | |
|---|---|---|---|---|---|
| READ | 1.5V | 1.5V | 0V | 0V | |
| RAISE Vth | -10V | 10V | -10V | -10V | (BATCH) |
| LOWER Vth | 10V | -10V | 0V | 0V | (FOR EACH BIT) |

FIG.7
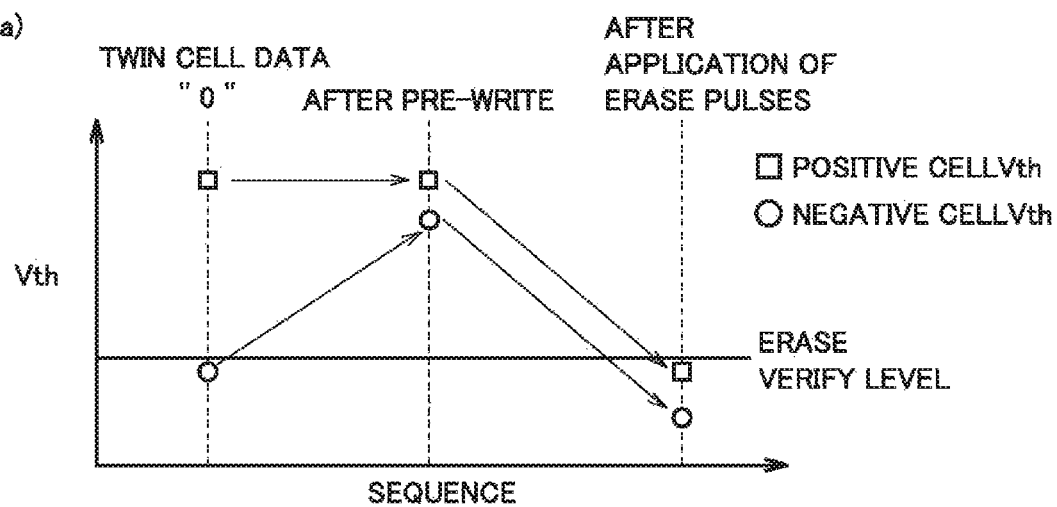
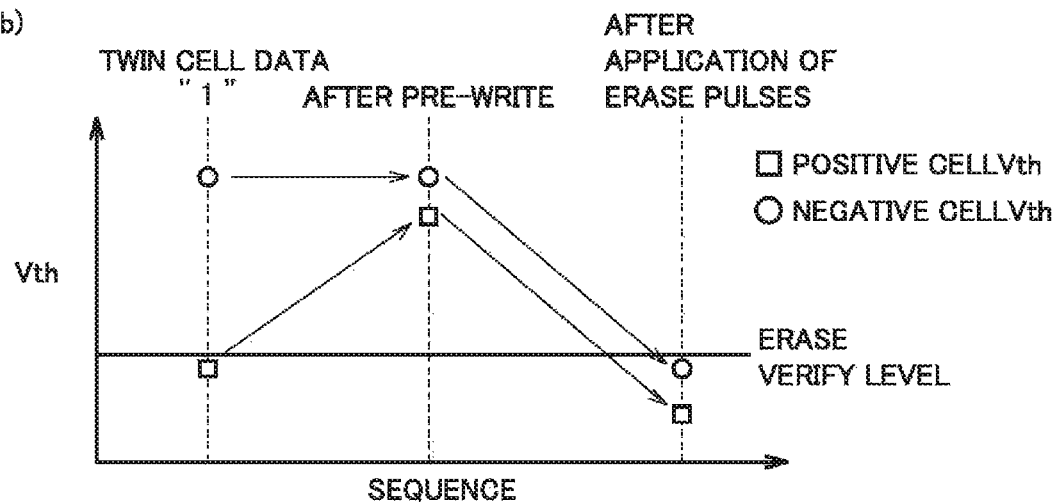

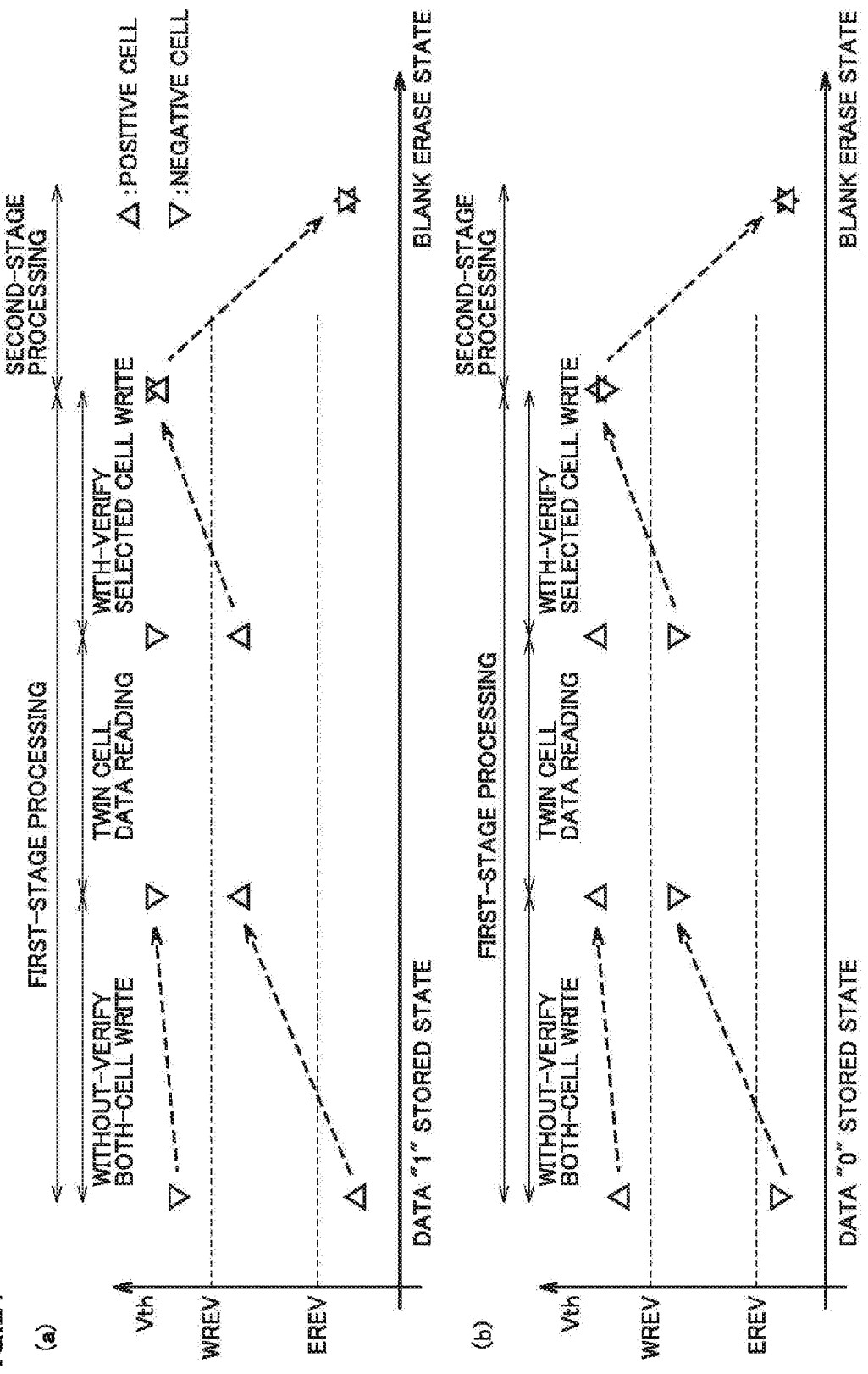

SEMICONDUCTOR DEVICE

TECHNICAL FIELD

The present invention relates to a semiconductor device, and for example, to a semiconductor device including two non-volatile memory cells holding complementary data.

BACKGROUND ART

A scheme for write before erase (pre-write) in a non-volatile memory has conventionally been known.

For example, a flash erase non-volatile memory described in Japanese Patent Laying-Open No. 10-64288 (PTD 1) carries out write before erase by successively updating an address of a memory cell array (1) while a first write-before-erase end signal (FWE) is at an inactive level. Then, this memory carries out verify for each address when an active level is set, and carries out control such that write before erase (pre-write) and verify is carried out only on an address at which a result of verify has indicated failure.

A semiconductor non-volatile memory described in Japanese Patent Laying-Open No. 11-144476 (PTD 2) performs a pre-write operation for reading a plurality of memory cells defined as an erase unit in at least a memory array in an erase operation mode and setting a state of write of a prescribed amount by repetition of a unit write operation and a write determination operation onto memory cells where charges are not accumulated in floating gates. Then, this memory performs an erase operation for setting to a state of erase of a prescribed amount by repetition of a unit erase operation and an erase determination operation in a batch under an erase reference voltage onto the plurality of memory cells defined as the erase unit. This memory performs a write operation for setting to a state of write of a prescribed amount by repetition of a unit write operation and a write determination operation onto a selected memory cell in a write operation mode.

CITATION LIST

Patent Document

PTD 1: Japanese Patent Laying-Open No. 10-64288
PTD 2: Japanese Patent Laying-Open No. 11-144476

SUMMARY OF INVENTION

Technical Problem

In twin cells constituted of two cells which hold complementary data, threshold voltages of the two cells are both set to a low state by erasing twin cell data. Here, a difference in threshold voltage between the two cells in a write state before erase of the twin cell data may remain also after erase of the twin cell data. Therefore, in spite of erase of the twin cell data, a state of write before erase of the twin cell data may be read and a problem in terms of security may arise.

Under the scheme described in PTD 1, however, a pre-write sequence is accelerated, and such a problem in terms of security that write data before erase of the twin cell data is read in twin cells cannot be solved.

Under the scheme described in PTD 2, write before erase is carried out in a memory cell in which charges are not accumulated in the floating gate in order to prevent overerase, and a problem in terms of security in twin cells is not solved.

Other objects and novel features will become apparent from the description herein and the accompanying drawings.

Solution to Problem

According to one embodiment of the present invention, a control circuit controls execution of first-stage processing for increasing a threshold voltage of both or one of a first storage element and a second storage element until the threshold voltage of the first storage element and the threshold voltage of the second storage element attain to a prescribed write verify level when a request for erase of twin cell data is received. The control circuit controls execution of second-stage processing for lowering both of the threshold voltage of the first storage element and the threshold voltage of the second storage element until the threshold voltage of the first storage element and the threshold voltage of the second storage element attain to a prescribed erase verify level after the first-stage processing is performed.

Advantageous Effects of Invention

According to one embodiment of the present invention, reading of a write state before erase of twin cell data can be avoided.

BRIEF DESCRIPTION OF DRAWINGS

FIG. 5 is (a) a diagram showing an example of a bias voltage applied to a split gate flash memory element, (b) a diagram showing an example of a bias voltage applied to a stacked gate flash memory element under a hot carrier write scheme, and (c) a diagram showing an example of a bias voltage applied to a stacked gate flash memory element under an FN tunnel write scheme.

FIG. 7 is (a) a diagram showing a sequence in erasing twin cell data "0" and (b) a diagram showing a sequence in erasing twin cell data "1".

FIG. 21 is a diagram showing an example of change in threshold voltage Vth of positive cell MC1 and negative cell MC2 based on erase of twin cell data in the fifth embodiment.

DESCRIPTION OF EMBODIMENTS

Embodiments of the present invention will be described below with reference to the drawings.

First Embodiment

Figure 1:
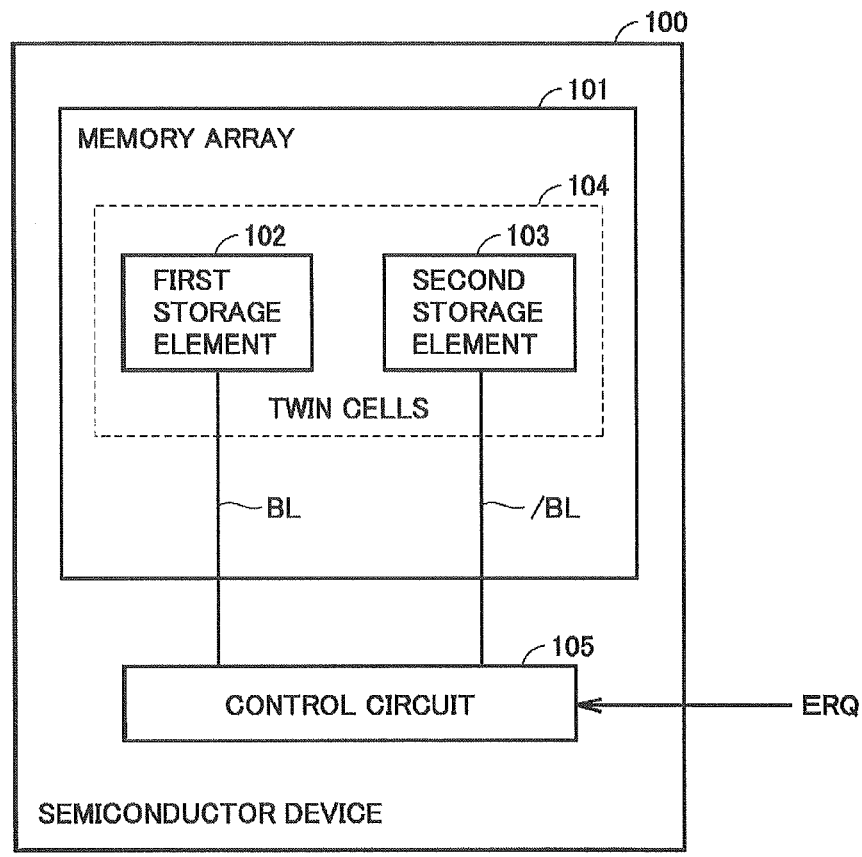
FIG. 1 is a diagram showing a configuration of a semiconductor device in a first embodiment.

FIG. 1 is a diagram showing a configuration of a semiconductor device in a first embodiment.

This semiconductor device 100 includes a memory array 101 and a control circuit 105.

Memory array 101 includes a plurality of twin cells 104. Twin cells 104 hold binary data (twin cell data) based on a difference in threshold voltage Vth, and are constituted of a first storage element 102 and a second storage element 103 each of which is electrically rewritable.

Control circuit 105 controls execution of first-stage processing for increasing threshold voltage Vth of both or one of first storage element 102 and second storage element 103 until threshold voltage Vth of first storage element 102 and second storage element 103 attains to a prescribed write verify level when a request for erase of twin cell data is received.

Control circuit 105 controls execution of second-stage processing for lowering threshold voltage Vth of both of first storage element 102 and second storage element 103 until threshold voltage Vth of first storage element 102 and second storage element 103 attains to a prescribed erase verify level after the first-stage processing is performed.

Figure 2:
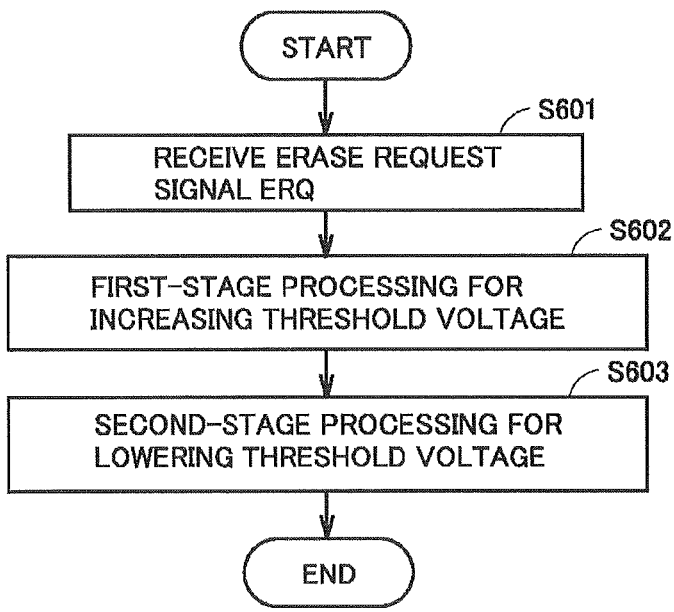
FIG. 2 is a flowchart showing a procedure in processing for erasing twin cell data from a memory array in the semiconductor device in the first embodiment.

FIG. 2 is a flowchart showing a procedure in processing for erasing twin cell data from memory array 101 in the semiconductor device in the first embodiment.

Initially, control circuit 105 receives an erase request signal ERQ (step S601).

Then, control circuit 105 controls execution of the first-stage processing for increasing a threshold voltage of both or one of first storage element 102 and second storage element 103 until threshold voltage Vth of first storage element 102 and second storage element 103 attains to a prescribed write verify level (step S602).

Then, control circuit 105 controls execution of the second-stage processing for lowering threshold voltage Vth of both of first storage element 102 and second storage element 103 until threshold voltage Vth of first storage element 102 and second storage element 103 attains to a prescribed erase verify level after the first-stage processing is performed (step S603).

As set forth above, according to the present embodiment, since a difference in threshold voltage Vth between first storage element 102 and second storage element 103 is decreased in the first-stage processing, a difference in magnitude between threshold voltage Vth of first storage element 102 and threshold voltage Vth of second storage element 103 after the second-stage processing can be irrelevant to a difference in magnitude between threshold voltage Vth of first storage element 102 and threshold voltage Vth of second storage element 103 before erase of twin cell data. Thus, such a problem in terms of security that a state of write before erase of twin cell data is read can be solved.

Second Embodiment

A semiconductor device in the present embodiment is implemented by a microcomputer.

(Microcomputer)

Figure 3:
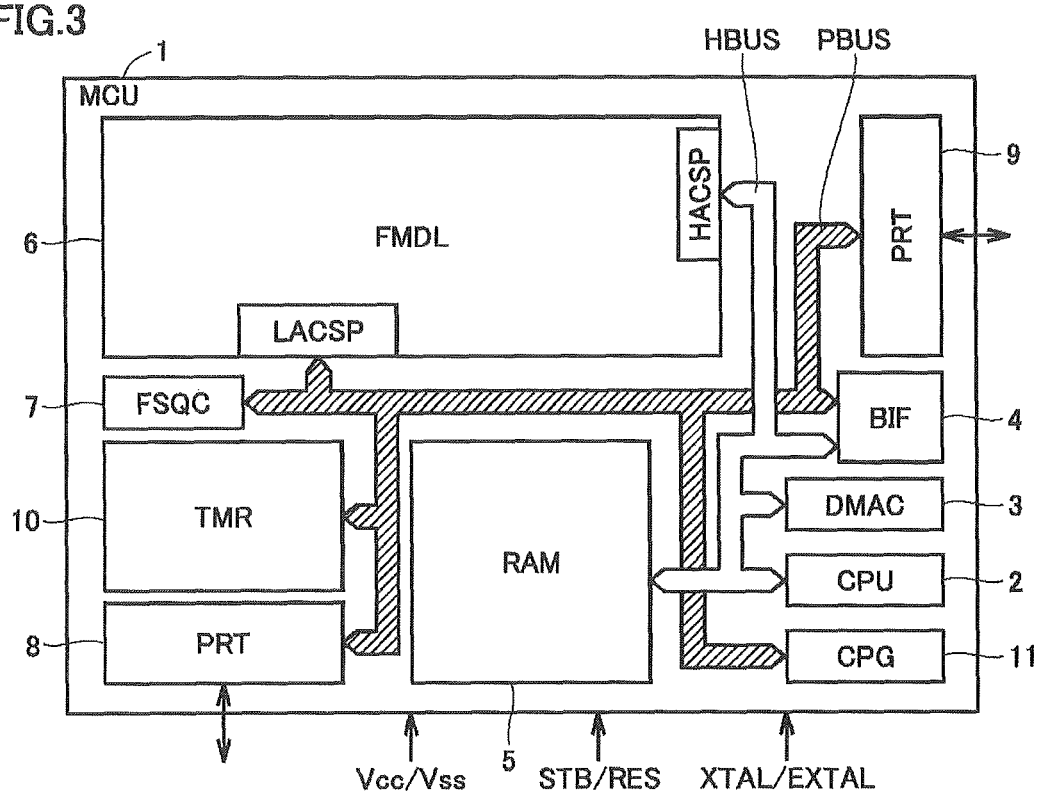
FIG. 3 is a diagram showing a configuration of a microcomputer in a second embodiment.

FIG. 3 is a diagram showing a configuration of a microcomputer 1 in a second embodiment.

Microcomputer (MCU) 1 shown in FIG. 3 is formed on one semiconductor chip as made of single crystal silicon, for example, with a technique for manufacturing a complementary MOS integrated circuit.

Though microcomputer 1 is not particularly restricted, it has a high-speed bus HBUS and a peripheral bus PBUS. Though high-speed bus HBUS and peripheral bus PBUS are not particularly restricted, each has a data bus, an address bus, and a control bus. By providing two buses, load imposed on the bus can be mitigated and a high-speed access operation can be ensured as compared with a case that all circuits are commonly connected to a common bus.

A central processing unit (CPU) 2 which includes an instruction control unit and an execution unit and executes instructions, a direct memory access controller (DMAC) 3, and a bus interface circuit (BIF) 4 carrying out bus interface control or bus bridge control between high-speed bus HBUS and peripheral bus PBUS are connected to high-speed bus HBUS.

Furthermore, a random access memory (RAM) 5 made use of as a work area of central processing unit 2 and a flash memory module (FMDL) 6 as a non-volatile memory module storing data or a program are connected to high-speed bus HBUS.

A flash sequencer (FSQC) 7 carrying out command access control on flash memory module (FMDL) 6, external input/output ports (PRT) 8 and 9, a timer (TMR) 10, and a clock pulse generator (CPG) 11 generating an internal clock CLK for controlling microcomputer 1 are connected to peripheral bus PBUS.

Microcomputer 1 includes a clock terminal having an oscillator connected to XTAL/EXTAL or supplied with an external clock, an external hardware stand-by terminal STB indicating a stand-by state, an external reset terminal RES indicating reset, an external power supply terminal Vcc, and an external ground terminal Vss.

Here, since flash sequencer 7 as a logic circuit and flash memory module 6 in an array configuration are designed with a separate CAD tool, they are illustrated as different circuit blocks for the sake of convenience, however, they together implement one flash memory. Flash memory module 6 is connected to high-speed bus HBUS through a read-only high-speed access port (HACSP). CPU 2 or DMAC 3 can read-access flash memory module 6 from high-speed bus HBUS through the high-speed access port. CPU 2 or DMAC 3 issues a command to flash sequencer 7 via peripheral bus PBUS through bus interface 4 when access for write and initialization is made to flash memory module 6. Thus, flash sequencer 7 controls an operation for initialization of or write into a flash memory module from peripheral bus PBUS through a low-speed access port (LACSP).

(Flash Memory Module)

Figure 4:
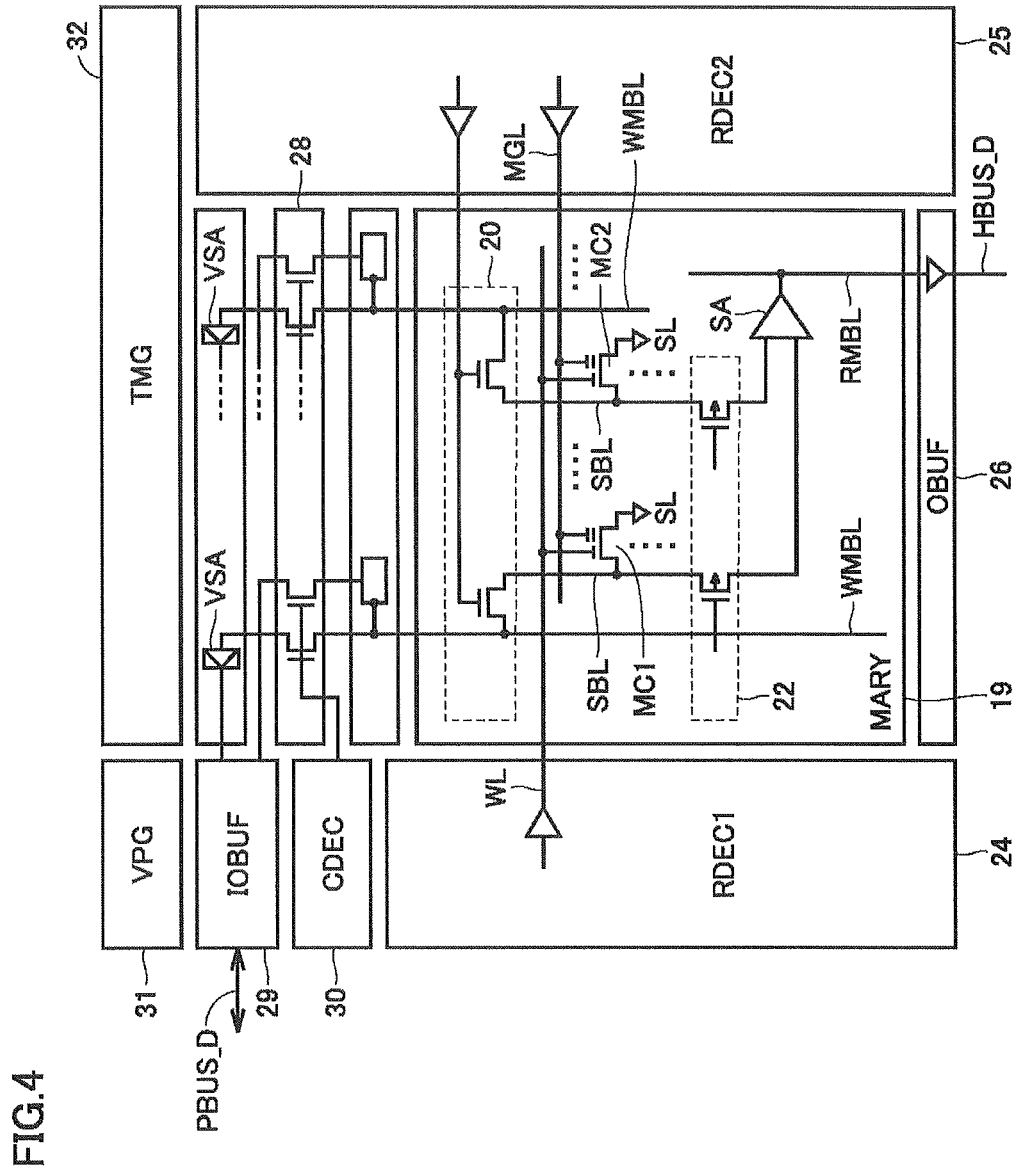
FIG. 4 is a diagram showing a configuration of a flash memory module.

FIG. 4 is a diagram showing a configuration of flash memory module 6.

Flash memory module 6 stores 1-bit information with the use of two non-volatile memory cells. Namely, a memory array (MARY) 19 includes a plurality of sets of two non-volatile memory cells MC1 and MC2 defined as one-bit twin cells, each of which is rewritable. FIG. 4 representatively shows only one pair. Herein, memory cell MC1 is called a positive cell and memory cell MC2 is called a negative cell. Naturally, flash memory module 6 may include a plurality of memory cells storing 1-bit information with one non-volatile memory cell. In such a case, memory cells are often arranged separately in flash memory module 6 in a memory array or in a unit of a memory block which results from division into a unit smaller than the memory array.

Volatile memory cells MC1 and MC2 are implemented, for example, by a split gate flash memory element exemplified in FIG. 5 (a). This memory element has a control gate CG and a memory gate MG arranged on a channel formation region between source and drain regions with a gate insulating film being interposed. An electron trap region (SiN) made of silicon nitride or the like is arranged between memory gate MG and the gate insulating film. The source or drain region on a side of a selection gate is connected to a bit line BL and the source or drain region on a side of the memory gate is connected to a source line SL.

In order to lower threshold voltage Vth of the memory cell, BL=Hi–Z (a high impedance state), CG=1.5 V, MG=–10 V, SL=6, and WELL=0V are set, and electrons are pulled from the electron trap region (SiN) to a well region (WELL) owing to high electric field between the well region (WELL) and memory gate MG. A plurality of memory cells which share memory gate MG are defined as this process unit.

In order to raise threshold voltage Vth of the memory cell, BL=0 V, CG=1.5 V, MG=10 V, SL=6, and WELL=0 V are set and a write current is fed from source line SL to the bit line, so that hot electrons generated in a boundary unit between control gate CG and memory gate MG are injected into the electron trap region (SiN). Since injection of electrons is determined based on whether or not to feed a bit line current, this processing is controlled in a unit of a bit.

Reading is carried out with BL=1.5 V, CG=1.5 V, MG=0 V, SL=0 V, and WELL=0 V being set. When threshold voltage Vth of the memory cell is low, the memory cell is set to on, and when threshold voltage Vth is high, the memory cell is set to off.

The memory cell is not limited to the split gate flash memory element, and may be a stacked gate flash memory element exemplified in FIG. 5 (b) and FIG. 5 (c). This memory element is configured as a floating gate FG and a control gate WL are stacked on the channel formation region between source and drain regions with a gate insulating film being interposed. In FIG. 5 (b), threshold voltage Vth is raised under a hot carrier write scheme and threshold voltage Vth is lowered by releasing electrons into well region WELL. In FIG. 5 (c), threshold voltage Vth is raised under an FN tunnel write scheme and the threshold voltage is lowered by releasing electrons into bit line BL.

A voltage applied to memory gate MG, control gate CG, source line SL, WELL, and bit line BL described above is generated in a power supply circuit (VPG) 31 and supplied under the control by flash sequencer 7.

In the description below, description will be given assuming that a memory element is implemented by a split gate flash memory element.

Information storage in one set of twin cells constituted of non-volatile memory cells MC1 and MC2 is achieved by storing complementary data in non-volatile memory cells MC1 and MC2.

Namely, each of memory cells MC1 and MC2 can hold cell data "1" (a low threshold voltage state; a threshold voltage being lower than an erase verify level) or cell data "0" (a high threshold voltage state; a threshold voltage being equal to or higher than the erase verify level).

Figure 6:
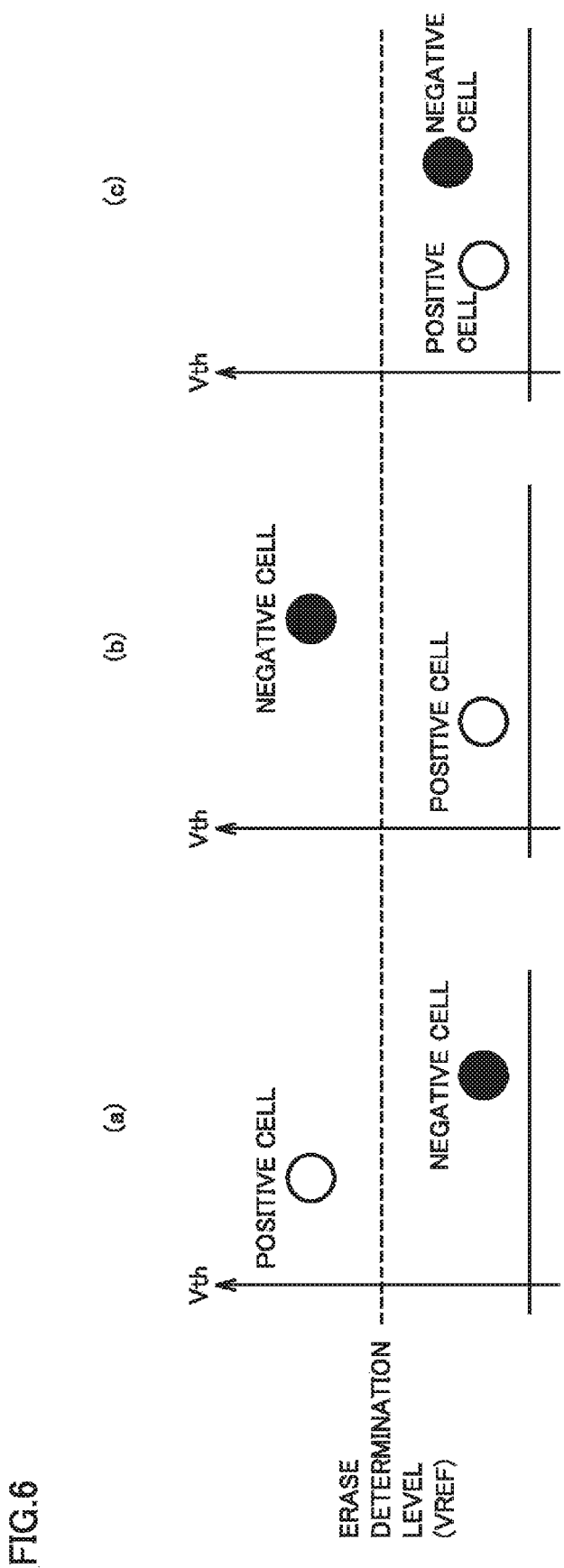
FIG. 6 is (a) a diagram showing a state that twin cell data stores "0", (b) a diagram showing a state that twin cell data stores "1", and (c) a diagram showing an initialized state of the twin cell data.

As shown in FIG. 6 (a), twin cell data "0" refers to a state that positive cell MC1 holds cell data "0" and negative cell MC2 holds cell data "1". As shown in FIG. 6 (b), twin cell data "1" refers to a state that positive cell MC1 holds cell data "1" and negative cell MC2 holds cell data "0". As shown in FIG. 6 (c), a state that both of positive cell MC1 and negative cell MC2 of the twin cells hold cell data "1" refers to an initialized state and the twin cell data is unsteady. The initialized state is also called a blank erase state.

Setting from a state of twin cell data "0" and a state of twin cell data "1" to the initialized state is referred to as erase of twin cell data. Setting from the initialized state to a state that twin cell data "1" is held or a state that twin cell data "0" is held is referred to as normal write.

In erasing twin cell data, after processing for setting cell data in both of positive cell MC1 and negative cell MC2 to "0" (called pre-write) is once performed, processing for setting cell data in both cells to "1" by applying erase pulses is performed. In pre-write, write weaker than in normal write is carried out by lowering a voltage to be applied to both of positive cell MC1 and negative cell MC2 as compared with a voltage in normal write or shortening a period of application of write pulses. In pre-write, an amount of increase in threshold voltage of a memory cell lower in threshold voltage is smaller than an amount of increase in threshold voltage Vth during normal write. The purpose of pre-write is to lessen variation in erase stress between positive cell MC1 and negative cell MC2 so as to suppress deterioration in retention characteristics. During pre-write, a voltage lower than a voltage during general normal write (increase in Vth) shown in FIG. 5 is applied such that stress applied during pre-write is not higher than stress applied during normal write.

FIG. 7 (a) is a diagram showing a sequence in erasing twin cell data "0".

As shown in FIG. 7 (a), in executing erase of twin cell data "0", as a result of pre-write, both of the cells are set to the initialized state in which cell data "1" is held. Before erase, however, threshold voltage Vth of positive cell MC1 is higher than threshold voltage Vth of negative cell MC2, and hence this relation may be maintained even after erase. When reading is carried out with this relation being maintained, data "0" equal to substantially immediately preceding twin cell data "0" may be read instead of an unsteady value because of a difference in threshold voltage Vth between positive cell MC1 and negative cell MC2 in spite of the initialized state being set.

FIG. 7 (b) is a diagram showing a sequence in erasing twin cell data "1".

As shown in FIG. 7 (b), in erasing twin cell data "1", as a result of pre-write, both cells are set to the initialized state in which cell data "1" is held. Before erase, however, threshold voltage Vth of negative cell MC2 is higher than threshold voltage Vth of positive cell MC1, and hence this relation may be maintained even after erase. When reading is carried out in this immediately preceding state of the twin cell data, data "1" equal to substantially immediately preceding twin cell data "1" may be read instead of an unsteady value because of a difference in threshold voltage Vth between positive cell MC1 and negative cell MC2 in spite of the initialized state being set.

If data equal to immediately preceding twin cell data is read at a high probability instead of such an unsteady value that data is not determined each time of reading in spite of such erase, a problem in terms of security can arise. The present embodiment aims to solve such a possible problem.

In memory cells MC1 and MC2 of the twin cells shown in FIG. 4, memory gate MG is connected to a common memory gate selection line MGL and control gate CG is connected to common word line WL. Actually, a large number of twin cells are arranged in matrix and connected to respective corresponding memory gate selection lines MGL and word lines WL in a unit aligned in a row direction.

Memory cells MC1 and MC2 are connected to a sub bit line SBL for each column and connected to a write system main bit line WMBL with a sub bit line selector 20 being interposed. A plurality of sub bit lines SBL are connected to respective write system main bit lines WMBL, as being layered by sub bit line selector 20. A unit resulting from layering into sub bit line SBL is referred to as a memory mat. Source line SL is connected to a ground voltage Vss. Sub bit line SBL of memory cell MC1 is connected to one input terminal of a layered sense amplifier SA with a read column selector 22 being interposed for each memory mat. Sub bit line SBL of memory cell MC2 is connected to the other input terminal of layered sense amplifier SA with read column selector 22 being interposed for each memory mat.

Word line WL is selected by a first row decoder (RDEC1) 24. Memory gate selection line MGL and sub bit line selector 20 are selected by a second row decoder (RDEC2) 25. A selection operation by first row decoder 24 and second row decoder 25 follows address information supplied to HACSP in read access and follows address information supplied to LACSP in a data write operation and an initialization operation. An output from layered sense amplifier SA is connected to a data bus HBUS_D of high-speed bus HBUS through an output buffer (OBUF) 26.

Write system main bit line WMBL is set such that a write current selectively flows in accordance with latch data of a write latch circuit 54. Write latch circuit 54 is selected by a rewrite column selector 28. Write system main bit line WMBL selected by rewrite column selector 28 is connected to a verify sense amplifier VSA. An output from verify sense amplifier VSA and write latch circuit 54 are connected to an input/output circuit (IOBUF) 29 interfaced with a data bus (PBUS_D) of peripheral bus PBUS.

Rewrite column selector 28 is selected by a column decoder (CDEC) 30. A selection operation by column decoder 30 follows address information supplied to LACSP.

Power supply circuit (VPG) 31 generates various operation voltages necessary for reading, writing, and initialization. A timing generator (TMG) 32 generates an internal control signal defining internal operation timing in accordance with an access strobe signal supplied from CPU 2 to HACSP and an access command supplied from FSQC 7 to LACSP.

A control unit of a flash memory is implemented by FSQC 7 and timing generator 32.

(Reading of Twin Cell Data)

Figure 8:
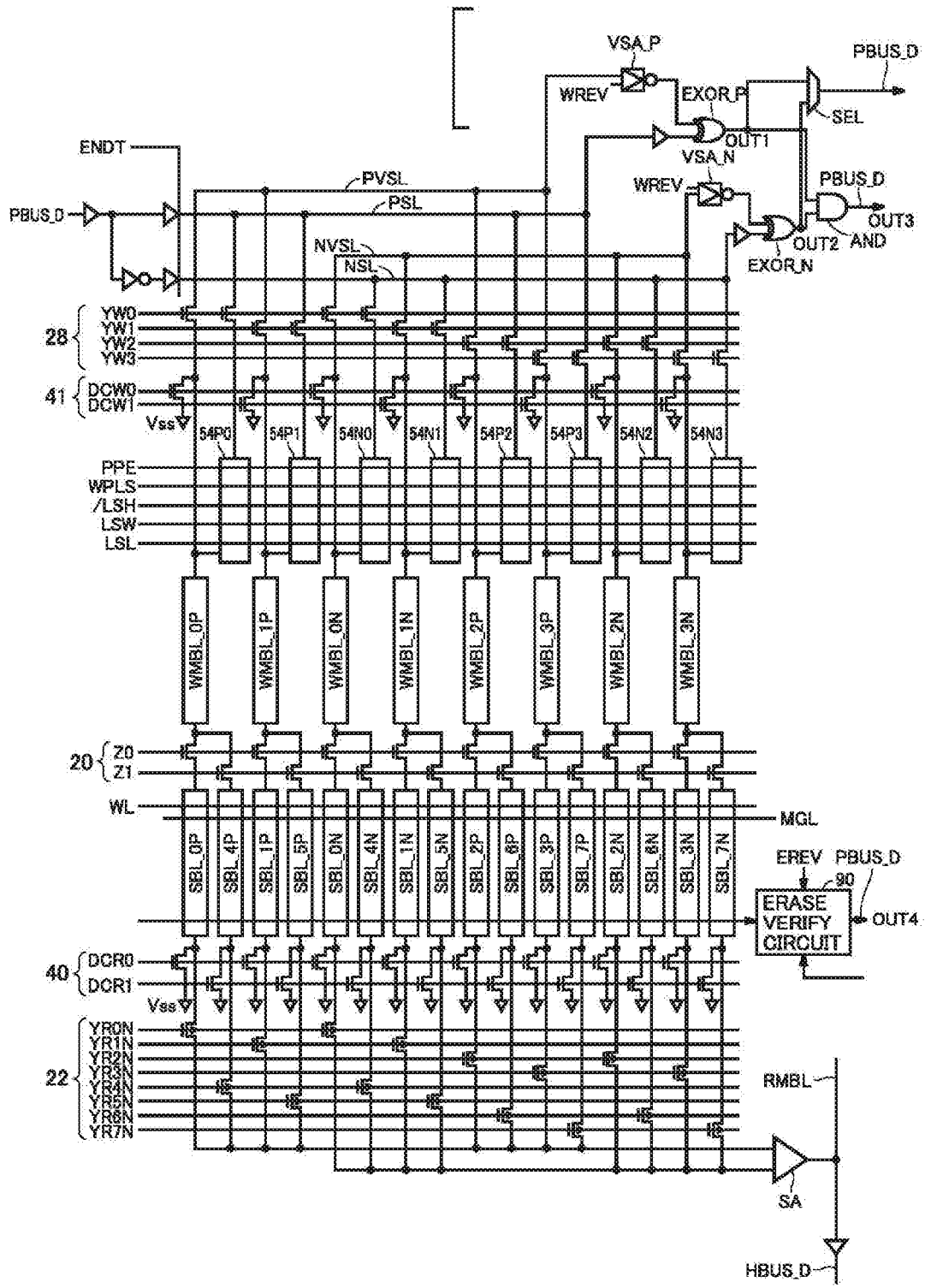
FIG. 8 is a diagram showing a detailed circuit configuration of a system for reading, writing, and erasing twin cell data in a second embodiment.

FIG. 8 is a diagram showing a detailed circuit configuration of a system for reading, writing, and erasing twin cell data in the second embodiment. Eight write system main bit lines of WMBL_0P to WMBL_3P and WMBL_0N to WMBL_3N are exemplified as write-system main bit lines, and one memory mat is exemplified as a memory mat connected thereto. Though not particularly restricted, SBL_0P to SBL_7P and SBL_0N to SBL_7N are arranged as sub bit lines, and two sub bit lines SBL are allocated to one write system main bit line WMBL.

A numerical suffix in a reference character provided to sub bit line SBL of which illustration is not provided for memory cells MC1 and MC2 means a column number of twin cells. An alphabetical suffix P means a sub bit line connected to memory cell MC1 (positive cell) which is one of twin cells, and a suffix N means a sub bit line connected to memory cell MC2 (negative cell) which is the other of the twin cells. An alphabetical suffix P in a reference character provided to write main bit line WMBL means a write main bit line connected to positive cell MC1 of twin cells, a suffix N means a write main bit line connected to negative cell MC2 of twin cells, and a numerical suffix means a column number smaller of column numbers of corresponding twin cells.

Selection signals YR0N to YR7N for controlling switching of read column selector 22 select a pair of sub bit lines SBL equal in column number of twin cells and have a sub bit line SBL_iP on a side of a selected positive cell and a sub bit line SBL_iN on a side of a negative cell connected to a differential input terminal of layered sense amplifier SA. Layered sense amplifier SA has a current source transistor (not shown) at a differential input terminal and the current source transistor is activated in a read operation. When twin cells are selected by a word line in a read operation, positive cell MC1 and negative cell MC2 of the selected twin cells perform a switching operation in a complementary manner in accordance with stored twin cell data, so that a potential difference is formed at the differential input terminal of layered sense amplifier SA. As layered sense amplifier SA amplifies this potential difference, the twin cell data is output to a read system main bit line RMBL.

Between the pair of sub bit lines selected by read column selector 22 based on arrangement of column numbers of twin cells and a form of selection of a sub bit line by read column selector 22, another sub bit line which is not selected at that time is arranged.

A read system discharge circuit 40 is a circuit selectively connecting sub bit line SBL to ground voltage Vss in response to discharge signals DCR0 and DCR1, and connects sub bit line SBL not selected by sub bit line selector 20 to ground voltage Vss.

(Normal Write of Twin Cell Data)

Write data supplied from data bus PBUS_D to a non-inverted signal line PSL is selected by rewrite column selector 28 and supplied to write latch circuit 54Pi corresponding to main bit line WMBL_iP (i=0 to 3) allocated to positive cell MC1.

Inverted write data supplied from data bus PBUS_D to an inverted signal line NSL is selected by rewrite column selector 28 and supplied to write latch circuit 54Ni corresponding to main bit line WMBL_iN (i=0 to 3) allocated to negative cell MC2. ENDT is an input gate signal of write data to signal lines PSL and NSL.

Main bit line WMBL_iP (i=0 to 3) allocated to positive cell MC1 is commonly connected to a non-inverted verify signal line PVSL with rewrite column selector 28 being interposed. Main bit line WMBL_iN (i=0 to 3) allocated to negative cell MC2 is commonly connected to an inverted verify signal line NVSL with rewrite column selector 28 being interposed.

Write select signals YW0 to YW3 controlling switching of rewrite column selector 28 have a pair of main bit lines WMBL_jP and WMBL_jN (j=any of 0 to 3) equal in column number of twin cells connected to signal lines PSL and NSL and have write latch circuits 54PJ and 54Nj corresponding thereto connected to signal lines PSL and NSL.

In a normal write operation, write data input from data bus PBUS_D is input to signal lines PSL and NSL as complementary data, and latched in a pair of write latch circuits 54Pj and 54Nj selected by rewrite column selector 28. One of write latch circuits 54Pj and 54Nj latches data "1" and the other thereof latches data "0".

A write current from source line SL does not flow to main bit line WMBL corresponding to latch data "1", and a write current from source line SL flows to main bit line WMBL corresponding to latch data "0" in accordance with a pulse width of write pulses WPLS. Thus, cell data "0" is written into one memory cell of the selected twin cells (that is, threshold voltage Vth increases) and cell data "1" is written in the other memory cell (that is, threshold voltage Vth does not vary).

In write verify, information stored in twin cells for which a write operation has been selected is read on a corresponding pair of main bit lines WMBL_jP and WMBL_jN (j=any of 0 to 3), transmitted to verify signal lines PVSL and NVSL by means of rewrite column selector 28, and sent to verify sense amplifiers VSA_P and VSA_N.

Verify sense amplifier VSA_P checks whether or not threshold voltage Vth of positive cell MC1 is higher than a write verify level WREV based on comparison of magnitude of a current output from positive cell MC1 and a reference current. When threshold voltage Vth of positive cell MC1 is higher than write verify level WREV, verify sense amplifier VSA_P outputs an "L" level. When threshold voltage Vth of positive cell MC1 is equal to or lower than write verify level WREV, verify sense amplifier VSA_P outputs an "H" level.

Verify sense amplifier VSA_N checks whether or not threshold voltage Vth of negative cell MC2 is higher than write verify level WREV based on comparison of magnitude between a current output from negative cell MC2 and the reference current. When threshold voltage Vth of negative cell MC2 is higher than write verify level WREV, verify sense amplifier VSA_N outputs the "L" level. When threshold voltage Vth of negative cell MC2 is equal to or lower than write verify level WREV, verify sense amplifier VSA_N outputs the "H" level.

Data held in write latch circuits 54Pj and 54Nj in which write data is stored in a write operation is similarly transmitted to signal lines PSL and NSL by means of rewrite column selector 28. A state of data write in positive cell MC1 is verified by checking matching between an output from verify sense amplifier VSA_P and non-inverted write data in signal line PSL by using an exclusive logical sum gate EXOR_P. Similarly, a state of data write in negative cell MC2 is verified by checking matching between an output from verify sense amplifier VSA_N and inverted write data in inverted signal line NSL with an exclusive logical sum gate EXOR_N.

A logical product of an output OUT1 from exclusive logical sum gate EXOR_P and an output OUT2 from exclusive logical sum gate EXOR_N is calculated by an AND gate AND, and a result of the logical product is output from AND gate AND as a result OUT3 of write verify of 1-bit write data. When the write data has a plurality of bits, a result of verify is obtained by calculating a logical product of all outputs from the exclusive logical sum gates for a plurality of bits. Verify result OUT3 is supplied to flash sequencer 7 through peripheral data bus PBUS_D.

Output OUT1 from exclusive logical sum gate EXOR_P and output OUT2 from exclusive logical sum gate EXOR_N are selectively supplied to flash sequencer 7 through peripheral data bus PBUS_D via a data selector SEL.

A write system discharge circuit 41 is a circuit selectively connecting main bit line WMBL to ground voltage Vss in response to discharge signals DCW0 and DCW1, and connects main bit line WMBL which is not selected by rewrite column selector 28 to ground voltage Vss.

An erase verify circuit 90 is provided for each erase unit and executes erase verify. In erase verify, information stored in each set of twin cells in an erase target region is output to sub bit lines SBL_iP and SBL_iN and sent to verify sense amplifiers ESA_Pi and ESA_Ni.

Figure 9:
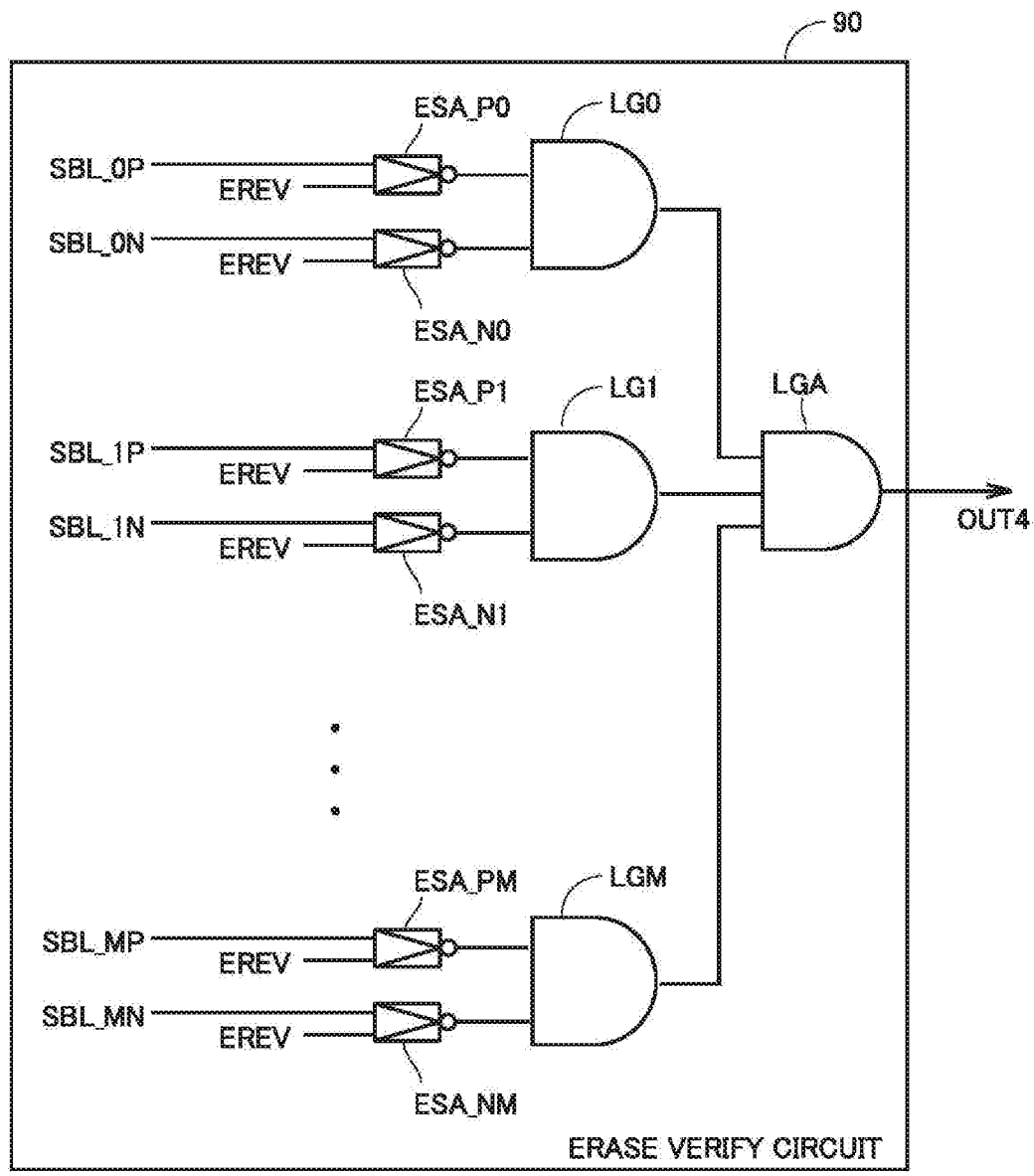
FIG. 9 is a diagram showing a configuration of an erase verify circuit.

FIG. 9 is a diagram showing a configuration of erase verify circuit 90. Here, it is assumed that an erase unit is defined as twin cells in (M+1) columns. That is, 2×(M+1) memory cells in the columns are defined as an erase unit.

Erase verify circuit 90 includes verify sense amplifiers ESA_P0 to ESA_PM, verify sense amplifiers ESA_N0 to ESA_NM, AND gates LG0 to LGM, and an AND gate LGA.

Verify sense amplifier ESA_Pi (i=0 to M) checks whether or not threshold voltage Vth of positive cell MC1 is lower than an erase verify level EREV based on comparison of magnitude between a current output from positive cell MC1 and the reference current. When threshold voltage Vth of positive cell MC1 is lower than erase verify level EREV, verify sense amplifier ESA_Pi outputs the "H" level. When threshold voltage Vth of positive cell MC1 is equal to or higher than erase verify level EREV, verify sense amplifier ESA_Pi outputs the "L" level.

Verify sense amplifier ESA_Ni checks whether or not threshold voltage Vth of negative cell MC2 is lower than erase verify level EREV based on comparison of magnitude between a current output from negative cell MC2 and the reference current. When threshold voltage Vth of negative cell MC2 is lower than erase verify level EREV, verify sense amplifier ESA_Ni outputs the "H" level. When threshold voltage Vth of negative cell MC2 is equal to or higher than erase verify level EREV, verify sense amplifier ESA_Ni outputs the "L" level.

AND gate LGi outputs a logical product of an output of verify sense amplifier ESA_Pi and an output of verify sense amplifier ESA_Ni.

AND gate LGA outputs a logical product OUT4 of outputs from AND gates LG0 to LGM to flash sequencer 7 through peripheral data bus PBUS_D.

(Write Latch Circuit)

Figure 10:
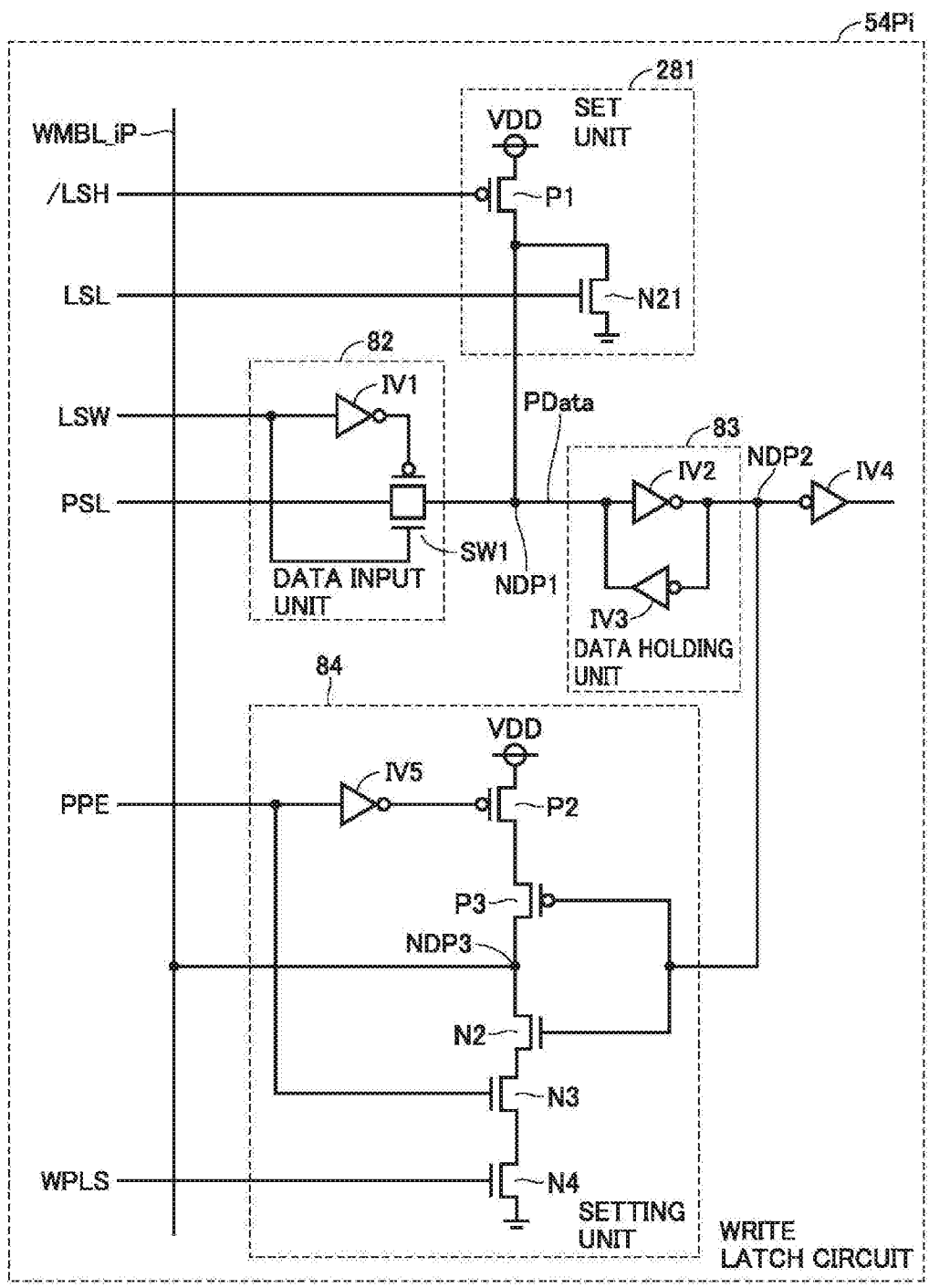
FIG. 10 is a diagram showing a configuration of a write latch circuit on a positive side in the second embodiment.

FIG. 10 is a diagram showing a configuration of write latch circuit 54Pi (i=0 to 3) in the second embodiment. As shown in FIG. 10, write latch circuit 54Pi includes a set unit 281, a data input unit 82, a data holding unit 83, a setting unit 84, and an inverter IV4.

Set unit 281 includes a P-channel MOS transistor P1 and an N-channel MOS transistor N21. P-channel MOS transistor P1 is provided between a line of a power supply voltage VDD and a node NDP1. A gate of P-channel MOS transistor P1 receives an inverted latch set high signal /LSH. N-channel MOS transistor N21 is provided between node NDP1 and a line of ground voltage Vss. A gate of N-channel MOS transistor N21 receives a latch set low signal LSL.

Data input unit 82 includes an inverter IV1 and a switch SW1. Inverter IV1 receives a latch switch signal LSW.

Switch SW1 receives non-inverted data transmitted through non-inverted signal line PSL and is controlled by latch switch signal LSW and an output from inverter IV1 (that is, an inverted signal of latch switch signal LSW). Switch SW1 allows transmission of non-inverted data transmitted through non-inverted signal line PSL to node NDP1 while latch switch signal LSW is at the "H" level.

Data holding unit 83 includes an inverter IV2 and an inverter IV3 which are alternately connected.

An input of inverter IV2 and an output of inverter IV3 are connected to node NDP1 and an output of inverter IV2 and an input of inverter IV3 are connected to a node NDP2.

An input of inverter IV4 is connected to node NDP2.

Setting unit 84 includes P-channel MOS transistors P2 and P3 provided between a line of power supply voltage VDD and a line of ground voltage Vss, N-channel MOS transistors N2, N3, and N4, and an inverter IV5. Inverter IV5 receives a program pulse activation signal PPE. A gate of P-channel MOS transistor P2 is connected to an output of inverter IV5. A gate of P-channel MOS transistor P3 and a gate of N-channel MOS transistor N2 are connected to node NDP2. A gate of N-channel MOS transistor N3 receives program pulse activation signal PPE. A gate of N-channel MOS transistor N4 receives write pulses WPLS. A node NDP3 between P-channel MOS transistor P3 and N-channel MOS transistor N2 is connected to main bit line WMBL_iP.

During write of twin cell data "1", the "H" level is sent through non-inverted signal line PSL so that data at node NDP1, that is, write latch data, attains to the "H" level and a voltage of main bit line WMBL_iP attains to VDD.

During write of twin cell data "0", the "L" level is sent through non-inverted signal line PSL so that data at node NDP1, that is, write latch data, attains to the "L" level, and during a period in which write pulses WPLS are activated, main bit line WMBL_iP is connected to ground voltage Vss and a write current flows to main bit line WMBL_iP.

During pre-write, latch set low signal LSL is set to the "H" level and inverted latch set high signal /LSH is set to the "H" level, so that data at node NDP1, that is, write latch data, attains to the "L" level. During a period in which write pulses WPLS are activated, main bit line WMBL_iP is connected to ground voltage Vss and a write current flows to main bit line WMBL_iP.

Figure 11:
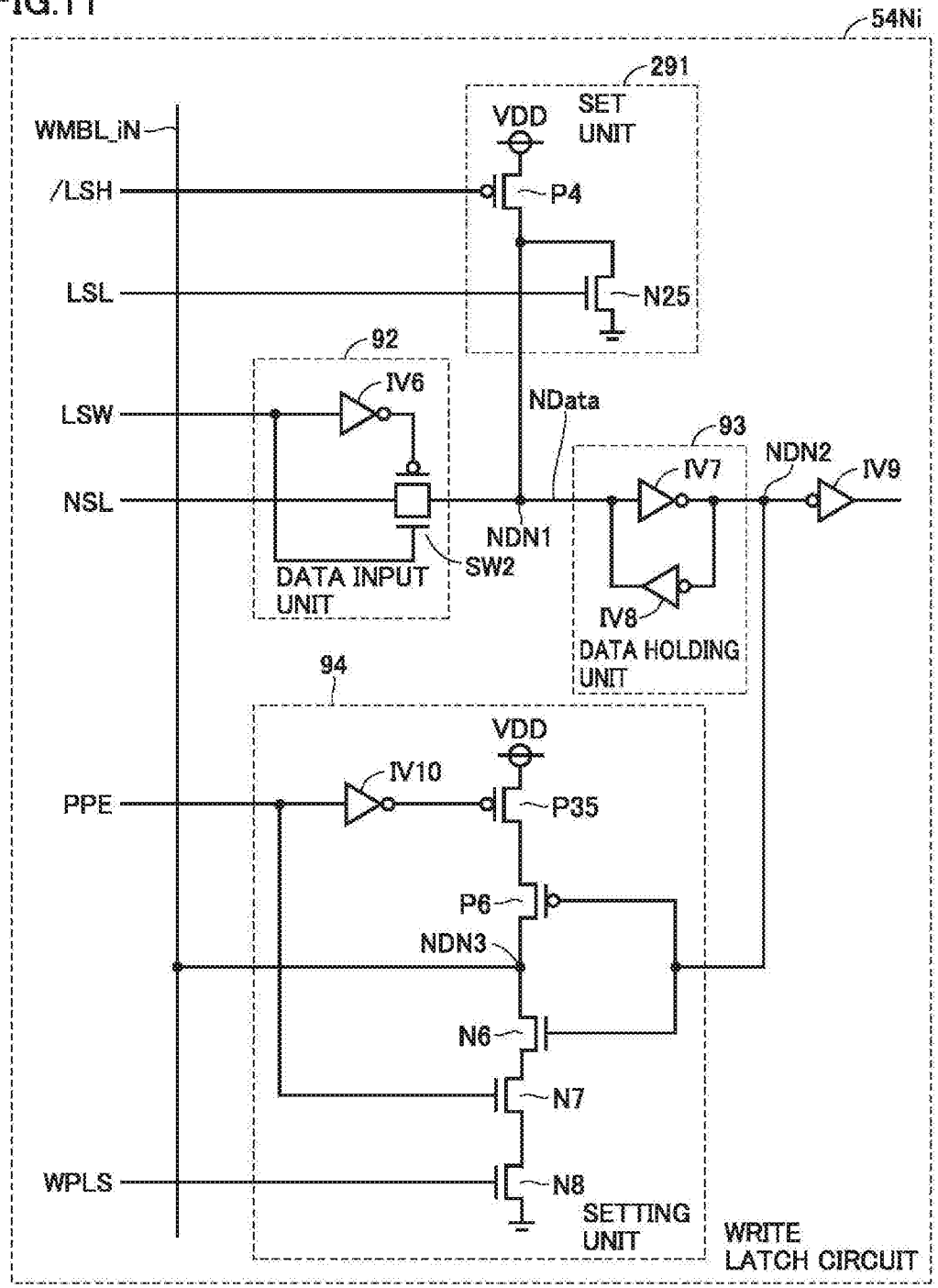
FIG. 11 is a diagram showing a configuration of a write latch circuit on a negative side in the second embodiment.

FIG. 11 is a diagram showing a configuration of write latch circuit 54Ni (i=0 to 3) in the second embodiment. As shown in FIG. 11, write latch circuit 54Ni includes a set unit 291, a data input unit 92, a data holding unit 93, a setting unit 94, and an inverter IV9.

Set unit 291 includes a P-channel MOS transistor P4 and an N-channel MOS transistor N25. P-channel MOS transistor P4 is provided between a line of power supply voltage VDD and a node NDN1. A gate of P-channel MOS transistor P4 receives inverted latch set high signal /LSH. N-channel MOS transistor N25 is provided between node NDN1 and a line of ground voltage Vss. A gate of N-channel MOS transistor N25 receives latch set low signal LSL.

Data input unit 92 includes an inverter IV6 and a switch SW2. Inverter IV6 receives latch switch signal LSW. Switch SW2 receives inverted data transmitted through inverted signal line NSL and is controlled by latch switch signal LSW and an output from inverter IV6 (that is, an inverted signal of latch switch signal LSW). Switch SW2 allows transmission of inverted data transmitted through inverted signal line NSL to node NDN1 while latch switch signal LSW is at the "H" level.

Data holding unit 93 includes an inverter IV7 and an inverter IV8 which are alternately connected. An input of inverter IV7 and an output of inverter IV8 are connected to node NDN1, and an output of inverter IV7 and an input of inverter IV8 are connected to a node NDN2.

An input of inverter IV9 is connected to node NDN2.

Setting unit 94 includes P-channel MOS transistor P35 and P6 provided between a line of power supply voltage VDD and a line of ground voltage Vss, N-channel MOS transistors N6, N7, and N8, and an inverter IV10. Inverter IV10 receives program pulse activation signal PPE. A gate of P-channel MOS transistor P5 is connected to an output of inverter IV10. A gate of P-channel MOS transistor P6 and a gate of N-channel MOS transistor N6 are connected to node NDN2. A gate of N-channel MOS transistor N7 receives program pulse activation signal PPE. A gate of N-channel MOS transistor N8 receives write pulses WPLS. A node NDN3 between P-channel MOS transistor P6 and N-channel MOS transistor N6 is connected to main bit line WMBL_iN.

During write of twin cell data "1", the "L" level is sent through inverted signal line NSL so that data at node NDN1, that is, write latch data, attains to the "L" level, and during a period in which write pulses WPLS are activated, main bit line WMBL_iN is connected to ground voltage Vss and a write current flows to main bit line WMBL_iN.

During write of twin cell data "0", the "H" level is sent through inverted signal line NSL, so that the data at node NDN1, that is, write latch data, attains to the "H" level and a voltage at main bit line WMBL_iN attains to VDD.

During pre-write, latch set signal LSL is set to the "H" level and inverted latch set high signal /LSH is set to the "H" level so that the data at node NDN1, that is, write latch data, attains to the "L" level. Then, during a period in which write pulses WPLS are activated, main bit line WMBL_iN is connected to ground voltage Vss and a write current flows to main bit line WMBL_iN.

(Erase of Twin Cell Data)

Figure 12:
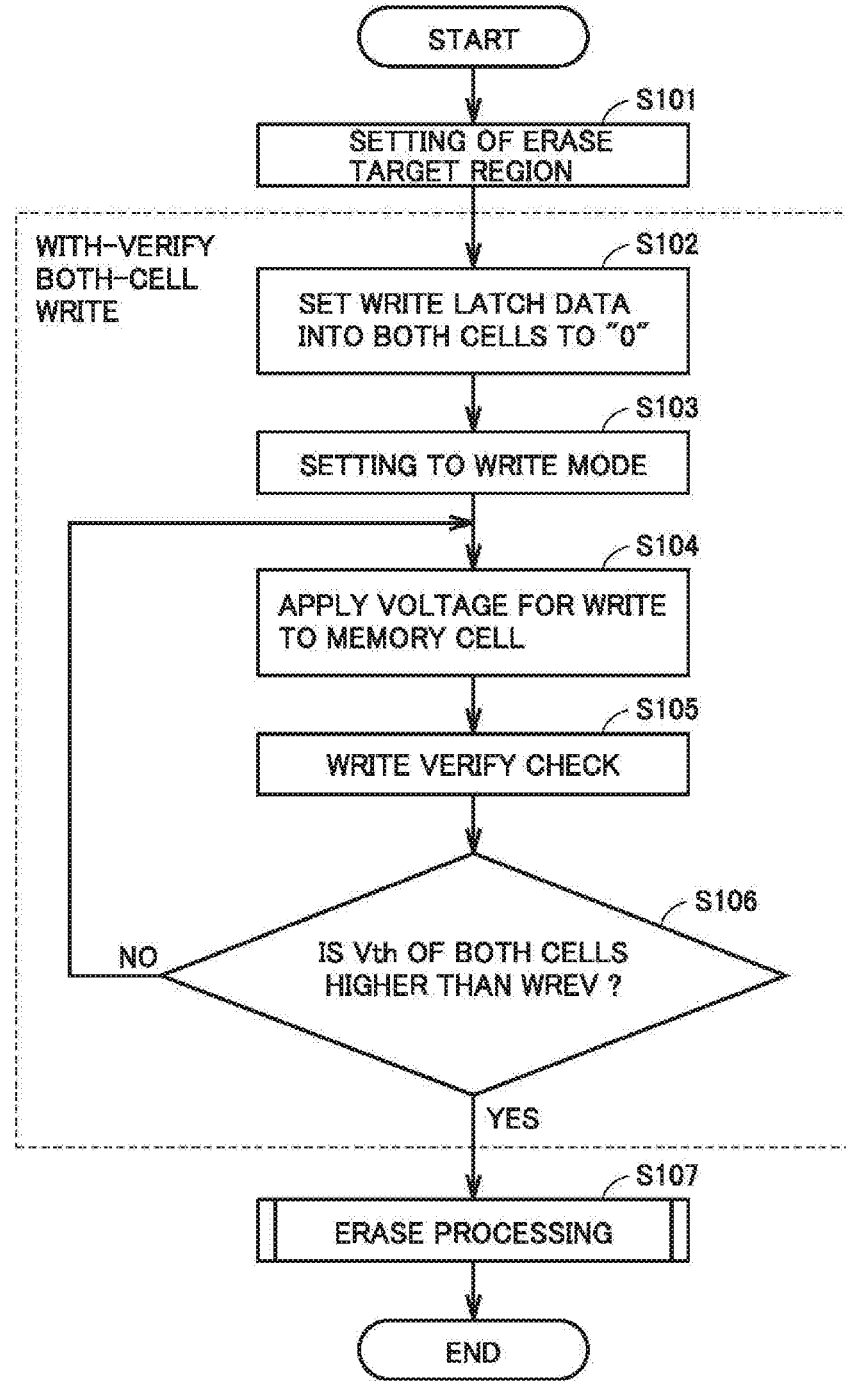
FIG. 12 is a flowchart showing a procedure in processing for erasing twin cell data in the second embodiment.

FIG. 12 is a flowchart showing a procedure in processing for erasing twin cell data in the second embodiment.

Initially, flash sequencer 7 sets an erase target region (step S101).

Then, flash sequencer 7 controls with-verify both-cell (positive cell MC1 and negative cell MC2) write in steps S102 to S106.

Flash sequencer 7 sets write latch data into all of both cells (positive cell MC1 and negative cell MC2) included in the erase target region to "0". Specifically, flash sequencer 7 sets the latch set high signal to the "L" level and sets the latch set low signal to the "H" level in write latch circuit 54Pi in FIG. 9. Thus, data at node NDP1, that is, write latch data, attains to the "L" level. Flash sequencer 7 sets the latch set high signal to the "L" level and sets the latch set low signal to the "H" level in write latch circuit 54Ni in FIG. 10. Thus, data at node NDN1, that is, write latch data, attains to the "L" level (step S102).

Then, flash sequencer 7 sets a write mode (step S103).

Then, flash sequencer 7 applies a voltage for write to all of both cells in the erase target region. Namely, flash sequencer 7 sets a voltage of memory gate MG to 10 V, a voltage of source line SL to 6 V, and a voltage of control gate CG to 1.5 V.

During a period in which write pulses WPLS are activated, in write latch circuit 54Pi in FIG. 9, main bit line WMBL_iP is connected to ground voltage Vss and a write current flows to main bit line WMBL_iP. Thus, a write current flows to sub bit lines SBL_iP and SBL_i+4P connected to main bit line WMBL_iP.

During a period in which write pulses WPLS are activated, in write latch circuit 54Ni in FIG. 10, main bit line WMBL_iN is connected to ground voltage Vss and a write current flows to main bit line WMBL_iN. Thus, a write current flows to sub bit lines SBL_iN and SBL_i+4N connected to main bit line WMBL_iN.

As a result of the above, threshold voltage Vth of all of both cells included in the erase target region increases (step S104).

Then, write verify check is carried out. Namely, when threshold voltage Vth of positive cell MC1 is higher than write verify level WREV, verify sense amplifier VSA_P outputs a signal at the "L" level. When threshold voltage Vth of negative cell MC2 is higher than write verify level WREV, verify sense amplifier VSA_N outputs a signal at the "L" level.

Exclusive logical sum gate EXOR_P outputs an exclusive logical sum of an output from verify sense amplifier VSA_P and write latch data "0" output from write latch circuit 54Pi to signal line PSL. Output OUT1 from exclusive logical sum gate EXOR_P is sent to flash sequencer 7 through peripheral data bus PBUS_D. Output OUT1 attains to the "H" level when threshold voltage Vth of positive cell MC1 is higher than write verify level WREV.

Exclusive logical sum gate EXOR_N outputs an exclusive logical sum of an output from verify sense amplifier VSA_N and write latch data "0" output from write latch circuit 54Ni to inverted signal line NSL. Output OUT2 from exclusive logical sum gate EXOR_N is sent to flash sequencer 7 through peripheral data bus PBUS_D. Output OUT2 attains to the "H" level when threshold voltage Vth of negative cell MC2 is higher than write verify level WREV (step S105).

When threshold voltage Vth of all of both cells included in the erase target region is not higher than write verify level WREV (NO in step S106), flash sequencer 7 maintains the write mode. Namely, the processing in steps S104 and S105 is repeated.

When threshold voltage Vth of all of both cells included in the erase target region is higher than write verify level WREV (YES in step S106), flash sequencer 7 controls next erase processing (step S107).

Figure 13:
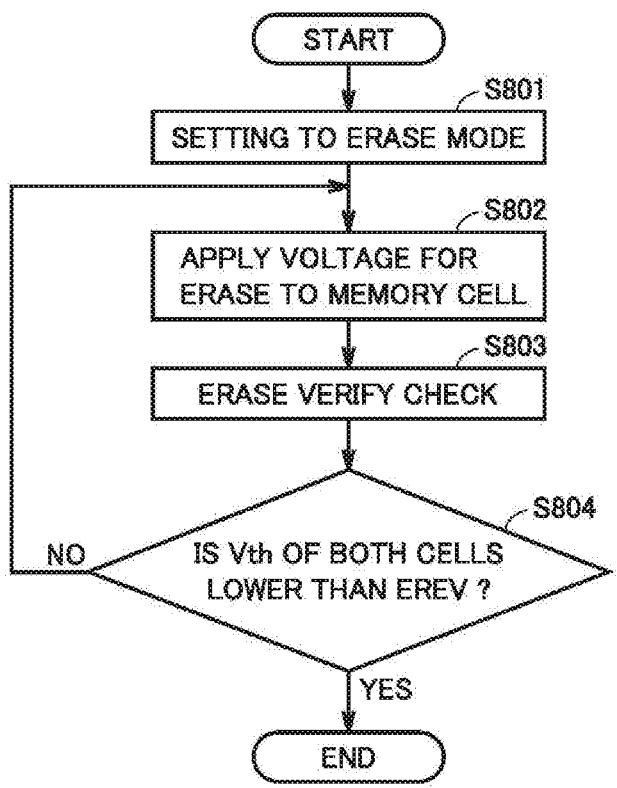
FIG. 13 is a flowchart showing a procedure in processing for erasing twin cell data.

FIG. 13 is a flowchart showing a procedure in processing for erasing twin cell data.

Flash sequencer 7 sets an erase mode (step S801).

Then, flash sequencer 7 applies a voltage for erase to all of both cells included in the erase target region. Namely, flash sequencer 7 sets a voltage of memory gate MG to 10 V, a voltage of source line SL to 6 V, and a voltage of control gate CG to 1.5 V (step S802).

Then, erase verify check is carried out. Namely, when threshold voltage Vth of positive cell MC1 is lower than erase verify level EREV, verify sense amplifier ESA_Pi outputs a signal at the "H" level. When threshold voltage Vth of negative cell MC2 is lower than erase verify level EREV, verify sense amplifier ESA_Ni outputs a signal at the "H" level.

AND gate LGi outputs a logical product of an output from verify sense amplifier ESA_Pi and an output from verify sense amplifier ESA_Ni. AND gate LGA outputs the logical product of outputs from AND gates LG0 to LGM. Output OUT4 from AND gate LGA is sent to flash sequencer 7 through peripheral data bus PBUS_D. Output OUT4 attains to the "H" level (step S803) when threshold voltage Vth of all positive cells MC1 included in the erase target region is lower than erase verify level EREV and threshold voltage Vth of all negative cells MC2 included in the erase target region is lower than erase verify level EREV.

When threshold voltage Vth of all of both cells included in the erase target region is not lower than erase verify level EREV (NO in step S804), flash sequencer 7 maintains the erase mode. Namely, the processing in steps S802 and S803 is repeated.

When threshold voltage Vth of all of both cells included in the erase target region is lower than erase verify level EREV (YES in step S804), flash sequencer 7 quits erase processing.

Figure 14:
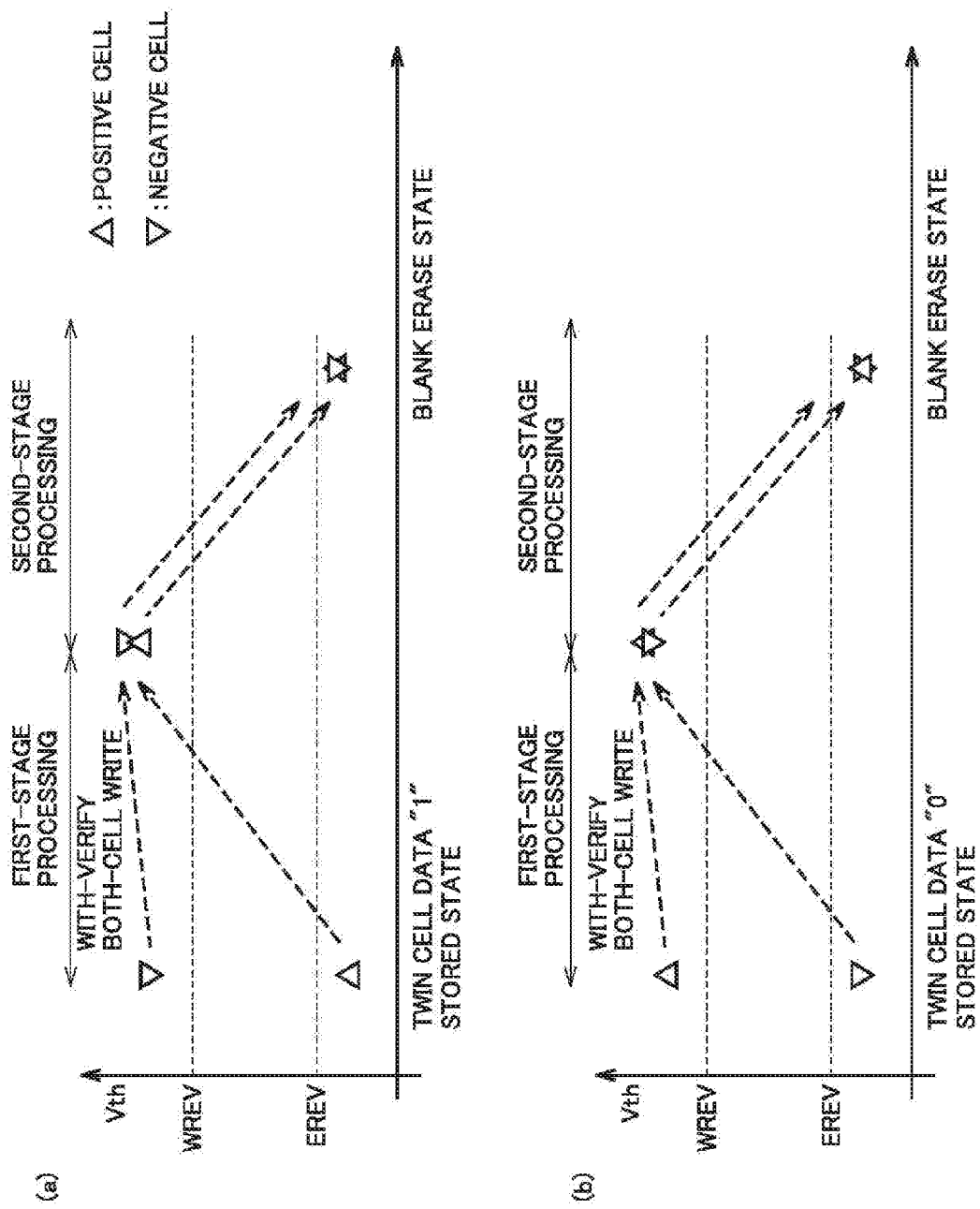
FIG. 14 is a diagram showing an example of change in threshold voltage Vth of a positive cell MC1 and a negative cell MC2 based on erase of twin cell data in the second embodiment.

FIG. 14 is a diagram showing an example of change in threshold voltage Vth of positive cell MC1 and negative cell MC2 based on erase of twin cell data in the second embodiment.

FIG. 14 (a) shows an example in which twin cell data is "1".

As a result of with-verify both-cell write in a first stage, threshold voltage Vth of positive cell MC1 and negative cell MC2 increases. Since threshold voltage Vth of negative cell MC2 reaches a saturation level, an amount of increase is small.

Since write verify is carried out here, threshold voltage Vth of positive cell MC1 is higher than write verify level WREV and a difference from threshold voltage Vth of negative cell MC2 becomes small. Therefore, in a blank erase state after erase processing in a second stage, a difference in threshold voltage Vth between positive cell MC1 and negative cell MC2 becomes small. Consequently, reading of data "1" held in twin cells before erase of twin cell data can be prevented.

FIG. 14 (b) shows an example in which twin cell data is "0".

As a result of with-verify both-cell write in the first stage, threshold voltage Vth of positive cell MC1 and negative cell MC2 increases. Since threshold voltage Vth of positive cell MC1 reaches the saturation level, an amount of increase is small Since write verify is carried out here, threshold voltage Vth of negative cell MC2 is higher than write verify level WREV and a difference from threshold voltage Vth of positive cell MC1 becomes small. Therefore, in the blank erase state after erase processing in the second stage, a difference in threshold voltage Vth between positive cell MC1 and negative cell MC2 becomes small. Consequently, reading of data "0" held in twin cells before erase of twin cell data can be prevented.

As set forth above, according to the present embodiment, when a request for erase of twin cell data is received, a threshold voltage of both cells is increased to exceed the write verify level before the threshold voltage of both cells is lowered. Thus, a threshold voltage of both cells after the threshold voltage of the both cells is lowered can be irrelevant to a state of write before twin cell data is erased and such a problem in terms of security as reading of a write state before erase of twin cell data can be solved.

Third Embodiment

Figure 15:
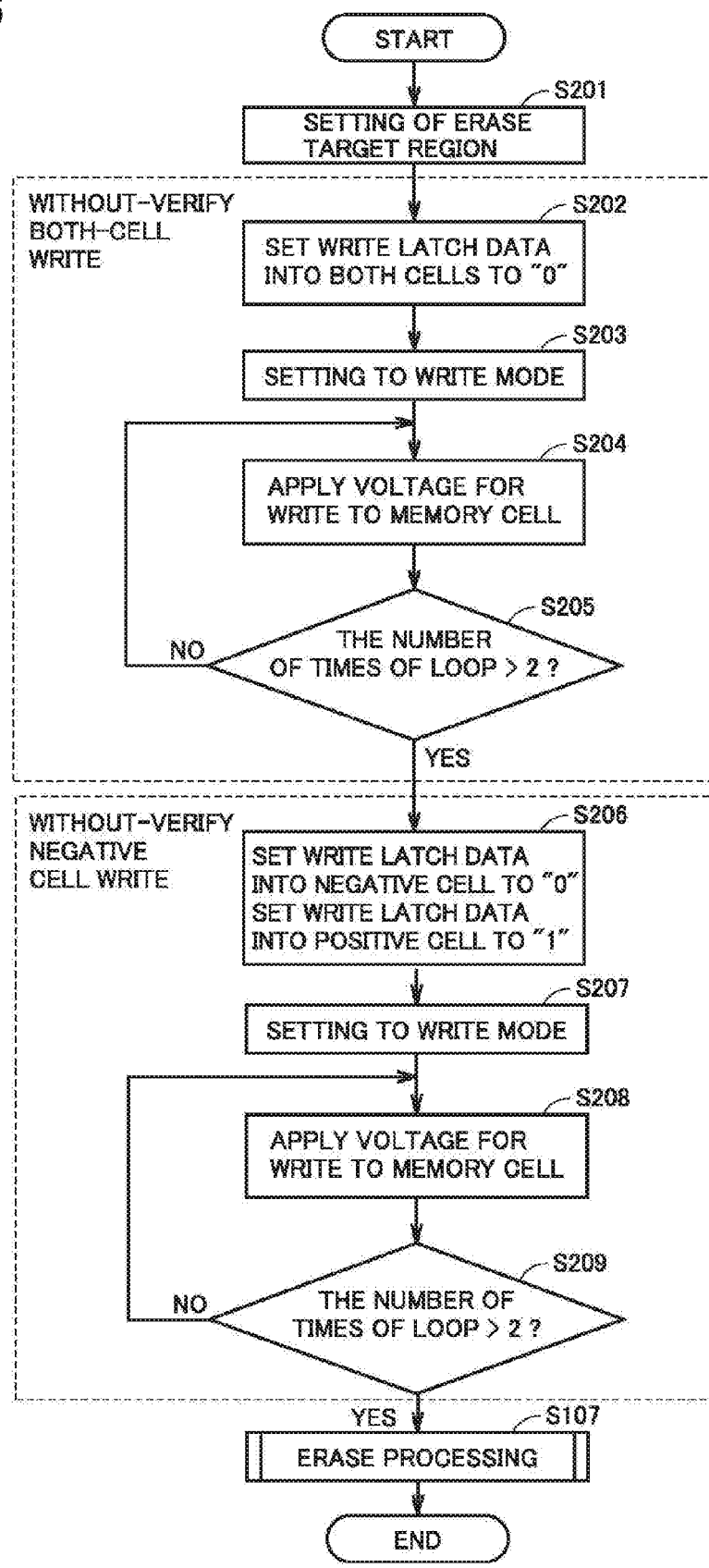
FIG. 15 is a flowchart showing a procedure in processing for erasing twin cell data in the third embodiment.

FIG. 15 is a flowchart showing a procedure in processing for erasing twin cell data in a third embodiment.

Initially, flash sequencer 7 sets an erase target region (step S201).

Then, flash sequencer 7 controls without-verify both-cell write in steps S202 to S205.

Flash sequencer 7 sets write latch data in all of both cells (positive cell MC1 and negative cell MC2) included in the erase target region to "0". Specifically, flash sequencer 7 sets a latch set high signal to the "L" level and sets a latch set low signal to the "H" level in write latch circuit 54Pi in FIG. 9. Thus, data at node NDP1, that is, write latch data, attains to the "L" level. A latch set high signal is set to the "L" level and a latch set low signal is set to the "H" level in write latch circuit 54Ni in FIG. 10. Thus, data at node NDN1, that is, write latch data, is set to the "L" level (step S202).

Then, flash sequencer 7 sets a write mode (step S203).

Then, flash sequencer 7 applies a voltage for write to all of both cells in the erase target region. Namely, flash sequencer 7 sets a voltage of memory gate MG to 10 V, a voltage of source line SL to 6 V, and a voltage of control gate CG to 1.5 V. Here, as in pre-write described above, write weaker than in normal write may be carried out by decreasing an applied voltage to be lower than a voltage for normal write or shortening a period of application of write pulses WPLS. In pre-write, an amount of increase in threshold voltage of a memory cell lower in threshold voltage is smaller than an amount of increase in threshold voltage Vth during normal write.

During a period in which write pulses WPLS are activated, in write latch circuit 54Pi in FIG. 9, main bit line WMBL_iP is connected to ground voltage Vss and a write current flows to main bit line WMBL_iP. Thus, a write current flows to sub bit lines SBL_iP and SBL_i+4P connected to main bit line WMBL_iP.

During a period in which write pulses WPLS are activated, in write latch circuit 54Ni in FIG. 10, main bit line WMBL_iN is connected to ground voltage Vss and a write current flows to main bit line WMBL_iN. Thus, a write current flows to sub bit lines SBL_iN and SBL_i+4N connected to main bit line WMBL_iN.

As a result of the above, threshold voltage Vth of all of both cells included in the erase target region increases (step S204).

Then, after processing in step S204 is performed twice (YES in step S205), flash sequencer 7 controls without-verify negative cell write in next steps S206 to S209. Flash sequencer 7 sets write latch data into negative cell MC2 included in the erase target region to "0" and sets write latch data into positive cell MC1 to "1". Specifically, flash sequencer 7 sets a latch set high signal to the "H" level and sets a latch set low signal to the "L" level in write latch circuit 54Pi in FIG. 9. Thus, data at node NDP1, that is, write latch data, attains to the "H" level. Flash sequencer 7 sets a latch set high signal to the "L" level and sets a latch set low signal to the "H" level in write latch circuit 54Ni in FIG. 10. Thus, data at node NDN1, that is, write latch data, attains to the "L" level (step S206).

Then, flash sequencer 7 sets a write mode (step S207).

Then, flash sequencer 7 applies a voltage for write to all of both cells in the erase target region. Namely, flash sequencer 7 sets a voltage of memory gate MG to 10 V, a voltage of source line SL to 6 V, and a voltage of control gate CG to 1.5 V. Here, as in pre-write described above, write weaker than in normal write may be carried out by decreasing an applied voltage to be lower than a voltage for normal write or shortening a period of application of write pulses WPLS.

During a period in which write pulses WPLS are activated, in write latch circuit 54Pi in FIG. 9, main bit line WMBL_iP is connected to power supply voltage VDD and a write current does not flow to main bit line WMBL_iP. Thus, a write current does not flow to sub bit lines SBL_iP and SBL_i+4p connected to main bit line WMBL_iP.

During a period in which write pulses WPLS are activated, in write latch circuit 54Ni in FIG. 10, main bit line WMBL_iN is connected to ground voltage Vss and a write current flows to main bit line WMBL_iN. Thus, a write current flows to sub bit lines SBL_iN and SBL_i+4N connected to main bit line WMBL_iN.

As a result of the above, threshold voltage Vth of all negative cells MC2 included in the erase target region increases (step S208).

Then, after processing in step S208 is performed twice (YES in step S209), flash sequencer 7 controls next erase processing (step S107).

Figure 16:
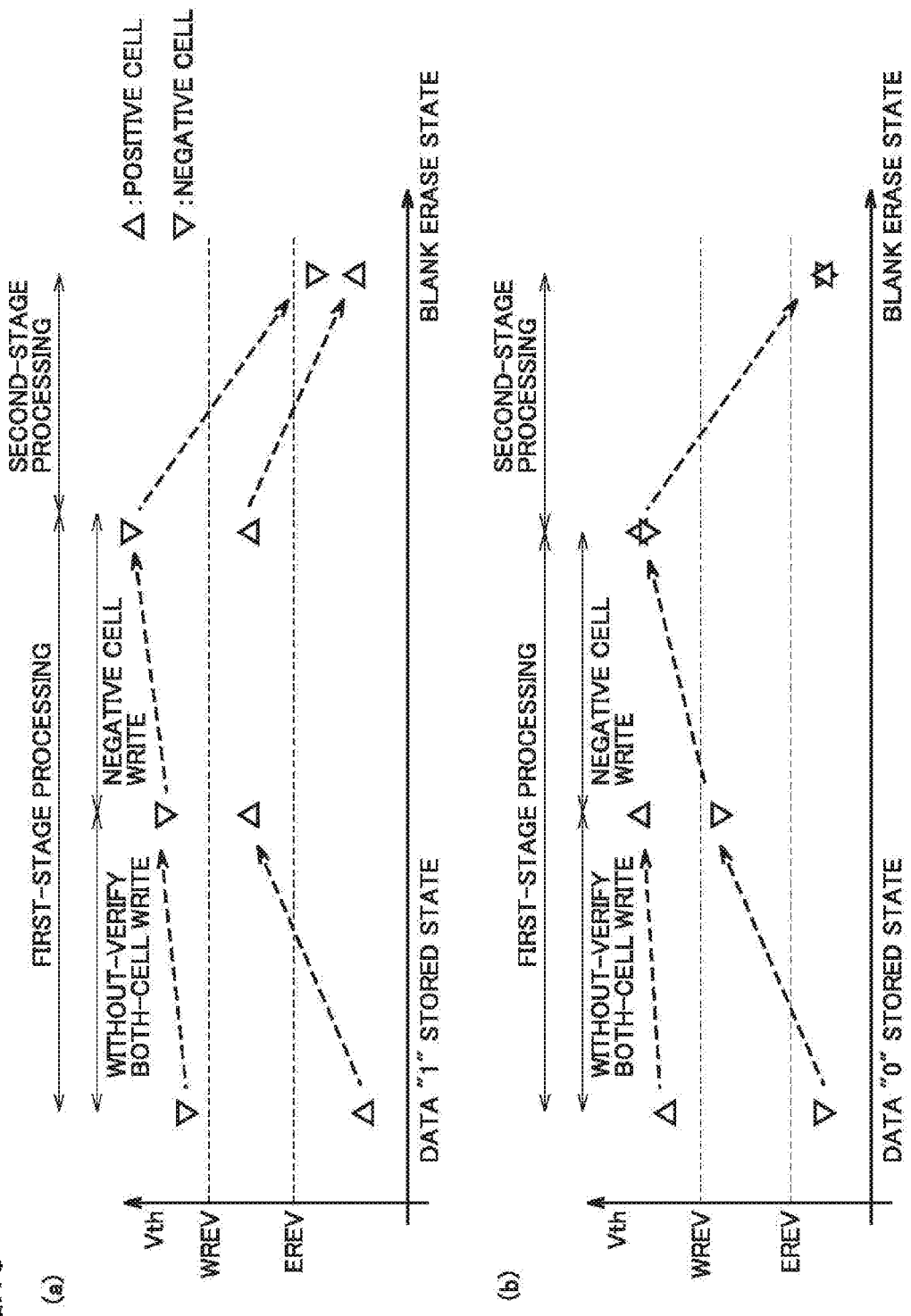
FIG. 16 is a diagram showing an example of change in threshold voltage Vth of positive cell MC1 and negative cell MC2 based on erase of twin cell data in the third embodiment.

FIG. 16 is a diagram showing an example of change in threshold voltage Vth of positive cell MC1 and negative cell MC2 based on erase of twin cell data in the third embodiment.

FIG. 16 (*a*) shows an example in which twin cell data is "1".

As a result of without-verify write into both cells in a first half of the first stage, threshold voltage Vth of positive cell MC1 and negative cell MC2 increases. Furthermore, as a result of without-verify write into negative cell MC2 in a latter half of the first stage, threshold voltage Vth of negative cell MC2 further increases, which results, however, in increase in difference between threshold voltage Vth of positive cell MC1 and threshold voltage Vth of negative cell MC2. Therefore, in the blank erase state after erase processing, a difference in threshold voltage Vth between positive cell MC1 and negative cell MC2 can be detected. Consequently, data "1" held in the twin cells before twin cell data is erased may be read, which, however, does not give rise to a problem as will be described later.

FIG. 16 (*b*) shows an example in which twin cell data is "0".

As a result of without-verify write into both cells in the first half of the first stage, threshold voltage Vth of positive cell MC1 and negative cell MC2 increases. Furthermore, as a result of without-verify write into negative cell MC2 in the latter half of the first stage, threshold voltage Vth of negative cell MC2 further increases, which results in decrease in difference between threshold voltage Vth of positive cell MC1 and threshold voltage Vth of negative cell MC2. Therefore, in the blank erase state after erase processing, a difference in threshold voltage Vth between positive cell MC1 and negative cell MC2 becomes small, and read data has such a value that "0" or "1" randomly fluctuates. Consequently, reading of data "0" held in twin cells before erase of twin cell data can be prevented.

As set forth above, though there is a possibility that twin cell data "1" is accurately read as being "1", it is uncertain whether twin cell data "0" is read as "0" or "1". Consequently, it is difficult to specify a value for twin cell data in accordance with a read value, and such a problem in terms of security as reading of a write state before erase of twin cell data can be solved.

When without-verify write into positive cell MC1 is carried out instead of without-verify write into negative cell MC2 in the latter half of the first stage as well, it becomes difficult to specify a value for twin cell data in accordance with a read value as in the embodiment described above and security can be ensured.

Modification of Third Embodiment

Figure 17:
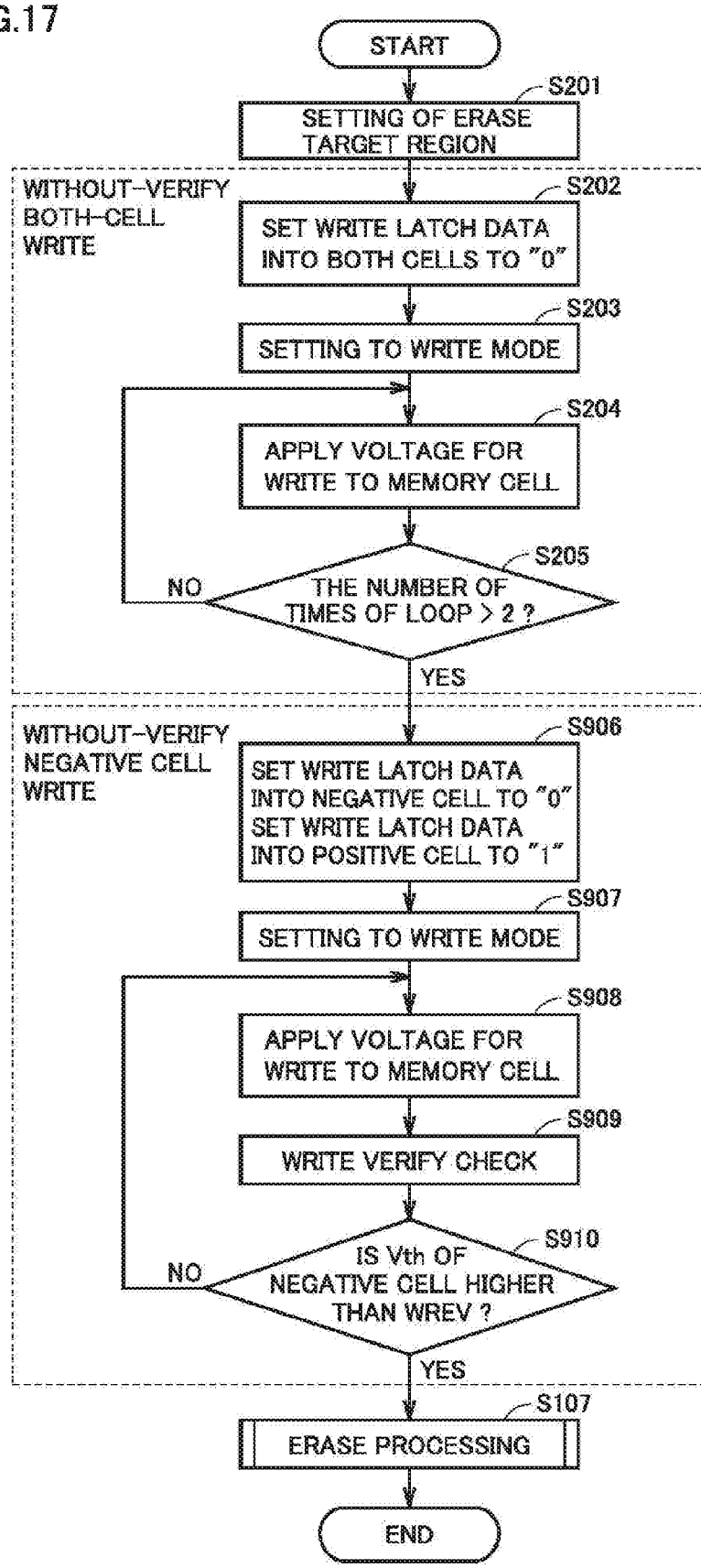
FIG. 17 is a flowchart showing a procedure in processing for erasing twin cell data in a modification of the third embodiment.

FIG. 17 is a flowchart showing a procedure in processing for erasing twin cell data in a modification of the third embodiment.

This flowchart is different from the flowchart in FIG. 15 in without-verify negative cell write (steps S906 to S910). Steps S906 to S910 will be described below.

Flash sequencer 7 sets write latch data into negative cell MC2 included in the erase target region to "0" and write latch data into positive cell MC1 to "1". Specifically, flash sequencer 7 sets a latch set high signal to the "H" level and sets a latch set low signal to the "L" level in write latch circuit 54Pi in FIG. 9. Thus, data at node NDP1, that is, write latch data, attains to the "H" level. Flash sequencer 7 sets a latch set high signal to the "L" level and sets a latch set low signal to the "H" level in write latch circuit 54Ni in FIG. 10. Thus, data at node NDN1, that is, write latch data, attains to the "L" level (step S906).

Then, flash sequencer 7 sets a write mode (step S907).

Then, flash sequencer 7 applies a voltage for write to all of both cells in the erase target region. Namely, flash sequencer 7 sets a voltage of memory gate MG to 10 V, a voltage of source line SL to 6 V, and a voltage of control gate CG to 1.5 V. Here, decrease in voltage to be applied to be lower than a voltage for normal write or shortening of a period of application of write pulses WPLS is not carried out as in pre-write.

During a period in which write pulses WPLS are activated, in write latch circuit 54Pi in FIG. 9, main bit line WMBL_iP is connected to power supply voltage VDD and a write current does not flow to main bit line WMBL_iP. Thus, a write current does not flow to sub bit lines SBL_iP and SBL_i+4P connected to main bit line WMBL_iP.

During a period in which write pulses WPLS are activated, in write latch circuit 54Ni in FIG. 10, main bit line WMBL_iN is connected to ground voltage Vss and a write current flows to main bit line WMBL_iN. Thus, a write current flows to sub bit lines SBL_iN and SBL_i+4N connected to main bit line WMBL_iN.

As a result of the above, threshold voltage Vth of all of negative cells MC2 included in the erase target region increases (step S908).

Then, write verify check is carried out. Namely, when threshold voltage Vth of negative cell MC2 is higher than write verify level WREV, verify sense amplifier VSA_N outputs a signal at the "L" level. Exclusive logical sum gate EXOR_N outputs an exclusive logical sum of an output from verify sense amplifier VSA_N and write latch data "0" output from write latch circuit 54Ni to inverted signal line NSL. Output OUT2 from exclusive logical sum gate EXOR_N is sent to flash sequencer 7 through peripheral data bus PBUS_D. When threshold voltage Vth of negative cell MC2 is higher than write verify level WREV, output OUT2 attains to the "H" level (step S909).

When threshold voltage Vth of all of negative cells MC2 included in the erase target region is not higher than write verify level WREV (NO in step S910), flash sequencer 7 maintains the write mode. Namely, the processing in steps S908 and S909 is repeated.

When threshold voltage Vth of all of negative cells MC2 included in the erase target region is higher than write verify level WREV (YES in step S910), flash sequencer 7 controls next erase processing (step S107).

According to the present modification, since threshold voltage Vth of negative cell MC2 is reliably higher than the erase verify level in write into negative cell MC2 in the latter half of the first stage, security can more reliably be ensured.

Fourth Embodiment

Figure 18:
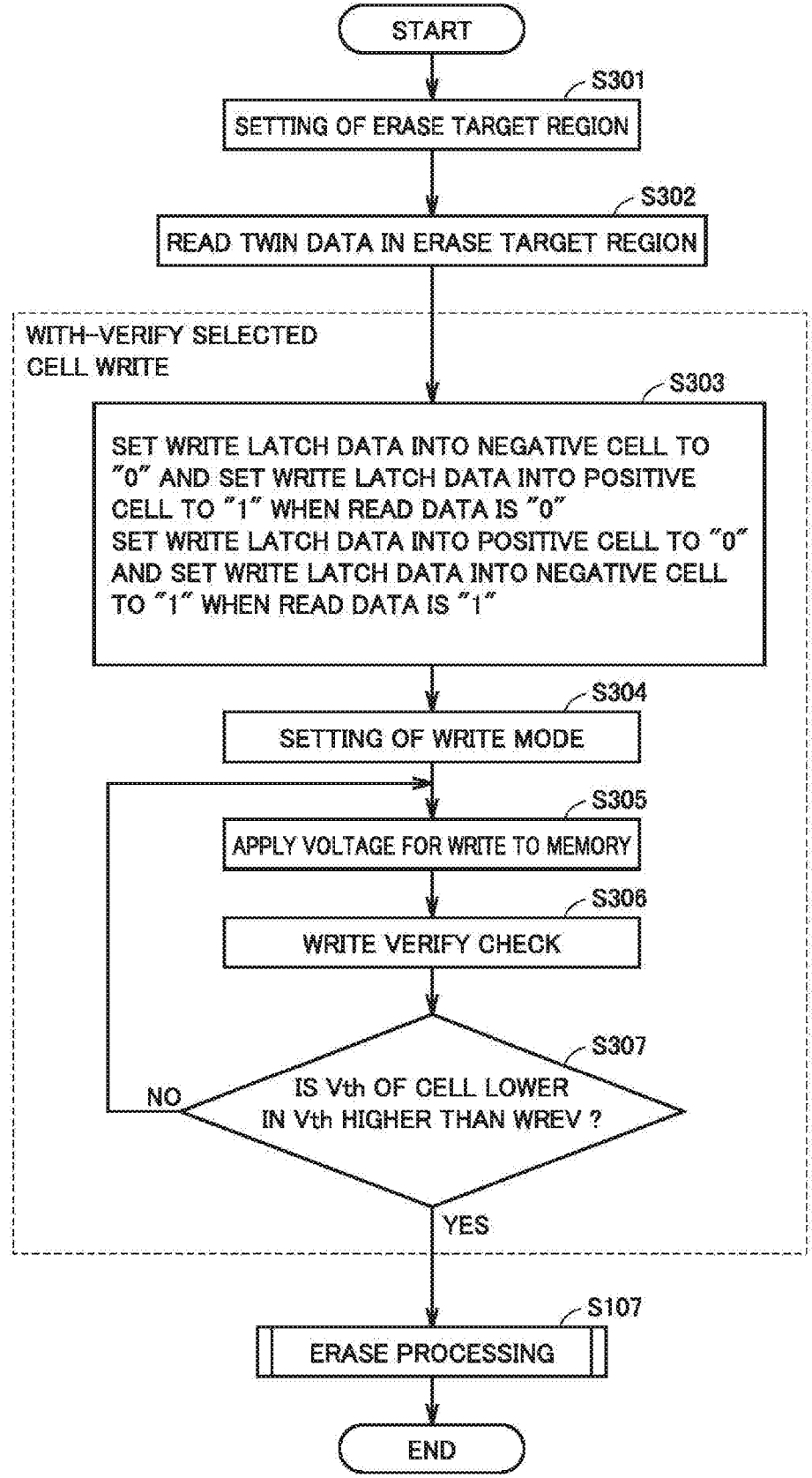
FIG. 18 is a flowchart showing a procedure in processing for erasing twin cell data in a fourth embodiment.

FIG. 18 is a flowchart showing a procedure in processing for erasing twin cell data in a fourth embodiment.

Initially, flash sequencer 7 sets an erase target region (step S301).

Then, flash sequencer 7 controls reading of twin cell data in the erase target region. Flash sequencer 7 applies a voltage for reading to all of both cells (positive cell MC1 and negative cell MC2) in the erase target region. Namely, flash sequencer 7 sets a voltage of memory gate MG to 0 V, a voltage of source line SL to 0 V, and a voltage of control gate CG to 1.5 V. When twin cell data is "0", data sent from layered sense amplifier SA to flash sequencer 7 is "0", and when twin cell data is "1", data sent from layered sense amplifier SA to flash sequencer 7 is "1" (step 302).

Then, flash sequencer 7 controls with-verify selected cell write in steps S303 to S307.

When read data is "0", flash sequencer 7 sets write latch data into negative cell MC2 to "0" and sets write latch data into positive cell MC1 to "1". When read data is "1", flash sequencer 7 sets write latch data into negative cell MC2 to "1" and sets write latch data into positive cell MC1 to "0".

Specifically, when read data is "1", flash sequencer 7 sets a latch set high signal to the "L" level and sets a latch set low signal to the "H" level in write latch circuit 54Pi in FIG. 9. Thus, data at node NDP1, that is, write latch data, attains to the "L" level. When read data is "0", flash sequencer 7 sets a latch set high signal to the "H" level and sets a latch set low signal to the "L" level in write latch circuit 54Pi in FIG. 9. Thus, data at node NDP1, that is, write latch data, attains to the "H" level.

When read data is "0", flash sequencer 7 sets a latch set high signal to the "L" level and sets a latch set low signal to the "H" level in write latch circuit 54Ni in FIG. 10. Thus, data at node NDN1, that is, write latch data, attains to the "L" level. When read data is "1", flash sequencer 7 sets a latch set high signal to the "H" level and sets a latch set low signal to the "L" level in write latch circuit 54Ni in FIG. 10. Thus, data at node NDN1, that is, write latch data, attains to the "H" level (step S303).

Then, flash sequencer 7 sets a write mode (step S304).

Then, flash sequencer 7 applies a voltage for write to all of both cells in the erase target region. Namely, flash sequencer 7 sets a voltage of memory gate MG to 10 V, a voltage of source line SL to 6 V, and a voltage of control gate CG to 1.5 V.

During a period in which write pulses WPLS are activated, when read data is "1", main bit line WMBL_iP is connected to ground voltage Vss and a write current flows to main bit line WMBL_iP in write latch circuit 54Pi in FIG. 9. Thus, a write current flows to sub bit lines SBL_iP and SBL_i+4P connected to main bit line WMBL_iP. During a period in which write pulses WPLS are activated, when read data is "0", main bit line WMBL_iP is connected to power supply voltage VDD and a write current does not flow to main bit line WMBL_iP in write latch circuit 54Pi in FIG. 9. Thus, a write current does not flow to sub bit lines SBL_iP and SBL_i+4P connected to main bit line WMBL_iP.

During a period in which write pulses WPLS are activated, in write latch circuit 54Ni in FIG. 10, when read data is "0", main bit line WMBL_iN is connected to ground voltage Vss and a write current flows to main bit line WMBL_iN. Thus, a write current flows to sub bit lines SBL_iN and SBL_i+4N connected to main bit line WMBL_iN. During a period in which write pulses WPLS are activated, in write latch circuit 54Ni in FIG. 10, when read data is "1", main bit line WMBL_iN is connected to power supply voltage VDD and a write current does not flow to main bit line WMBL_iN. Thus, a write current does not flow to sub bit lines SBL_iN and SBL_i+4N connected to main bit line WMBL_iN.

As a result of the above, threshold voltage Vth of positive cell MC1 or negative cell MC2 which is lower in threshold voltage Vth, of both cells included in the erase target region, increases (step S305).

Then, write verify check is carried out. Namely, when read data is "1" and when threshold voltage Vth of positive cell MC1 is higher than write verify level WREV, verify sense amplifier VSA_P outputs a signal at the "L" level. Exclusive logical sum gate EXOR_P outputs an exclusive logical sum of an output from verify sense amplifier VSA_P and write latch data "0" output from write latch circuit 54Pi to signal line PSL. Output OUT1 from exclusive logical sum gate EXOR_P is sent to flash sequencer 7 through peripheral data bus PBUS_D. Output OUT1 attains to the "H" level when threshold voltage Vth of positive cell MC1 is higher than write verify level WREV.

When read data is "0" and when threshold voltage Vth of negative cell MC2 is higher than write verify level WREV, verify sense amplifier VSA_N outputs a signal at the "L" level. Exclusive logical sum gate EXOR_N outputs an exclusive logical sum of an output from verify sense amplifier VSA_N and write latch data "0" output from write latch circuit 54Ni to inverted signal line NSL. Output OUT2 from exclusive logical sum gate EXOR_N is sent to flash sequencer 7 through peripheral data bus PBUS_D. Output OUT2 attains to the "H" level when threshold voltage Vth of negative cell MC2 is higher than write verify level WREV (step S306).

When threshold voltage Vth of a memory cell of which threshold voltage Vth has been increased, of all of both cells included in the erase target region, is not higher than write verify level WREV (NO in step S307), flash sequencer 7 maintains the write mode. Namely, the processing in steps S305 and S306 is repeated.

When threshold voltage Vth of the memory cell of which threshold voltage Vth has been increased, of all of both cells included in the erase target region, is higher than write verify level WREV (YES in step 307), flash sequencer 7 controls next erase processing (step S107).

Figure 19:
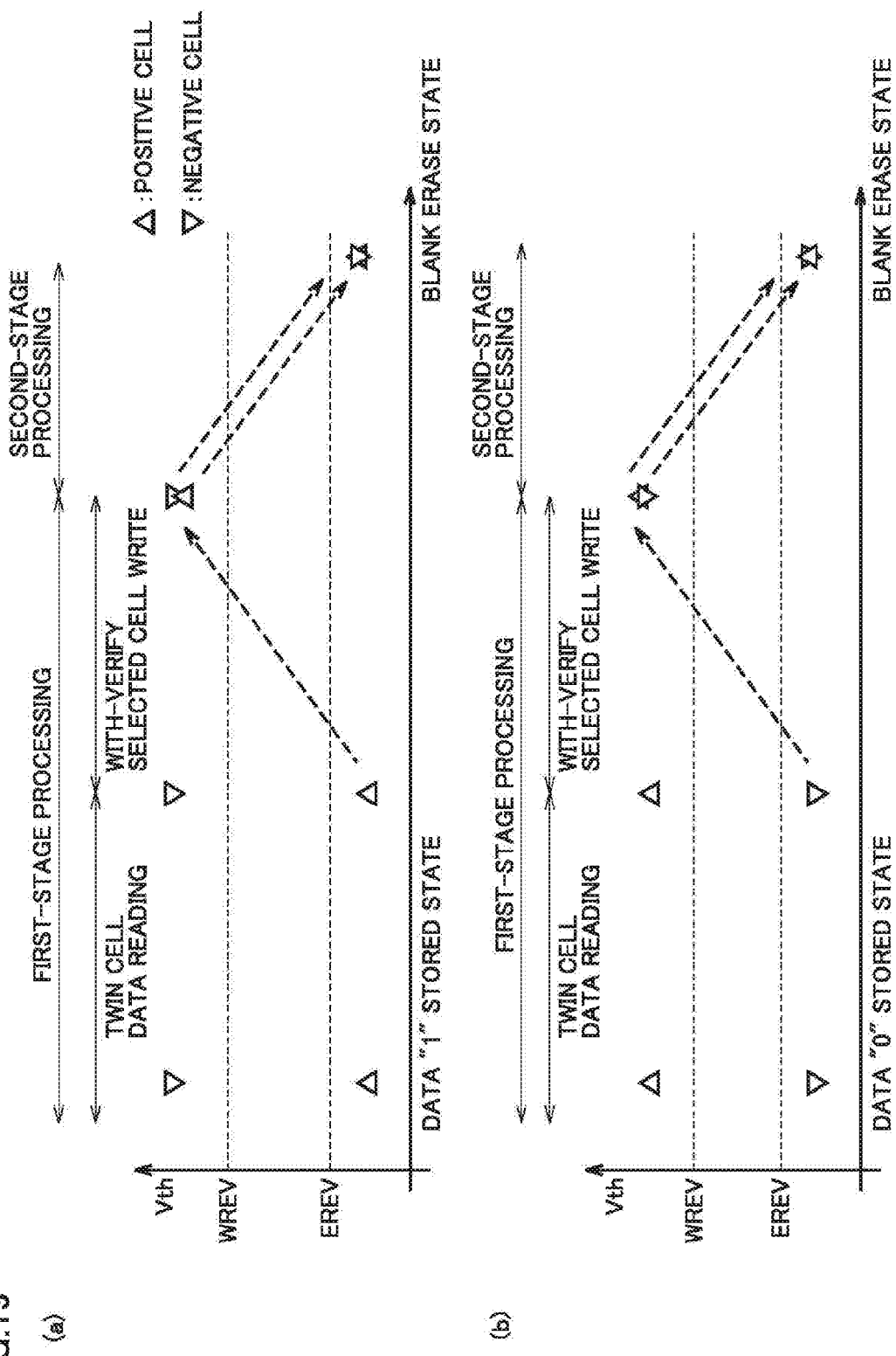
FIG. 19 is a diagram showing an example of change in threshold voltage Vth of positive cell MC1 and negative cell MC2 based on erase of twin cell data in the fourth embodiment.

FIG. 19 is a diagram showing an example of change in threshold voltage Vth of positive cell MC1 and negative cell MC2 based on erase of twin cell data in the fourth embodiment.

FIG. 19 (*a*) shows an example in which twin cell data is "1".

It can be seen that, as a result of reading of twin cell data in the first half of the first stage, twin cell data is "1" and negative cell MC2 is lower higher in threshold voltage Vth than positive cell MC1. As a result of with-verify selected cell write in the latter half of the first stage, threshold voltage Vth of positive cell MC1 increases. Consequently, a difference between threshold voltage Vth of positive cell MC1 and threshold voltage Vth of negative cell MC2 decreases. Therefore, in the blank erase state after erase processing, a difference in threshold voltage Vth between positive cell MC1 and negative cell MC2 becomes small and read data has such a value that "0" or "1" randomly fluctuates. Consequently, reading of data "1" held in twin cells before erase of twin cell data can be prevented. Furthermore, since threshold voltage Vth of negative cell MC2 is not increased in the first stage, stress applied for increasing a threshold voltage can be lessened.

FIG. 19 (*b*) shows an example in which twin cell data is "0".

It can be seen that, as a result of reading of twin cell data in the first half of the first stage, twin cell data is "0" and positive cell MC1 is higher in threshold voltage Vth than negative cell MC2. As a result of with-verify selected cell write in the latter half of the first stage, threshold voltage Vth of negative cell MC2 increases. Consequently, a difference between threshold voltage Vth of positive cell MC1 and threshold voltage Vth of negative cell MC2 decreases. Therefore, in the blank erase state after erase processing, a difference in threshold voltage Vth between positive cell MC1 and negative cell MC2 becomes small and read data has such a value that "0" or "1" randomly fluctuates. Consequently, reading of data "0" held in twin cells before erase of twin cell data can be prevented. Furthermore, since threshold voltage Vth of positive cell MC1 is not increased in the first stage, stress applied for increasing a threshold voltage can be lessened.

Fifth Embodiment

Figure 20:
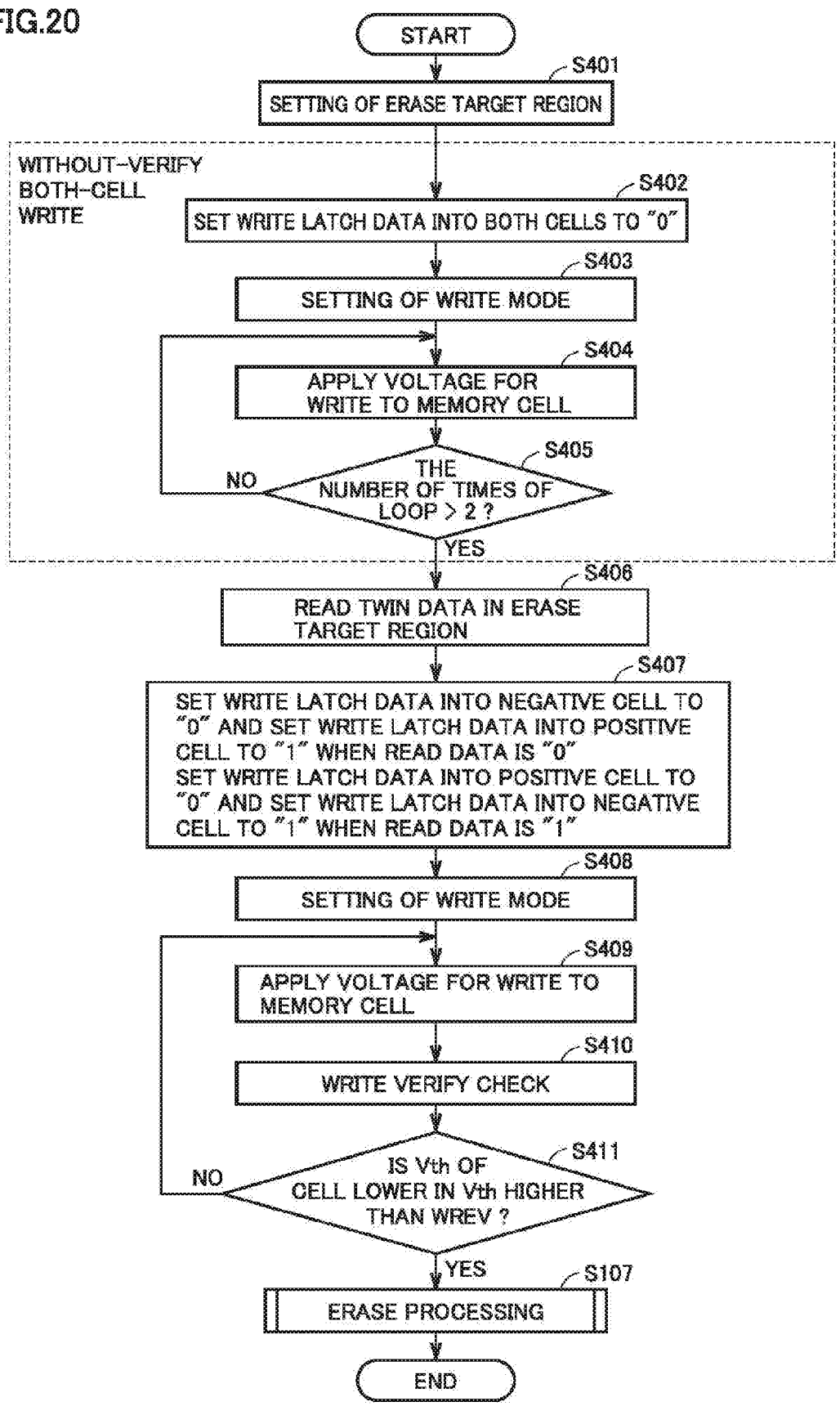
FIG. 20 is a flowchart showing a procedure in processing for erasing twin cell data in a fifth embodiment.

FIG. 20 is a flowchart showing a procedure in processing for erasing twin cell data in a fifth embodiment.

Initially, flash sequencer 7 sets an erase target region (step S401).

Then, flash sequencer 7 controls without-verify both-cell write in steps S402 to S405. Since processing in steps S402 to S405 is the same as the processing in steps S202 to S205 in FIG. 15, description will not be repeated.

Then, flash sequencer 7 reads twin cell data in the erase target region (step 406). Since the processing in step S406 is the same as the processing in step S302 in FIG. 18, description will not be repeated.

Then, flash sequencer 7 controls with-verify selected cell write in steps S407 to S411. Since processing in steps S407 to S411 is the same as the processing in steps S303 to S307 in FIG. 18, description will not be repeated.

Then, flash sequencer 7 controls erase processing (step S107).

FIG. 21 is a diagram showing an example of change in threshold voltage Vth of positive cell MC1 and negative cell MC2 based on erase of twin cell data in the fifth embodiment.

FIG. 21 (*a*) shows an example in which twin cell data is "1".

As a result of without-verify both-cell write in a first step in the first stage, threshold voltage Vth of positive cell MC1 and negative cell MC2 increases. It can be seen that, as a result of reading of twin cell data in a second step in the first stage, twin cell data is "1" and negative cell MC2 is higher in threshold voltage Vth than positive cell MC1. As a result of with-verify selected cell write in a third step in the first stage, threshold voltage Vth of positive cell MC1 further increases. Consequently, a difference between threshold voltage Vth of positive cell MC1 and threshold voltage Vth of negative cell MC2 decreases. Therefore, in the blank erase state after erase processing, a difference in threshold voltage Vth between positive cell MC1 and negative cell MC2 becomes small and read data has such a value that "0" or "1" randomly fluctuates. Consequently, reading of data "1" held in twin cells before erase of twin cell data can be prevented. Furthermore, since threshold voltage Vth of negative cell MC2 is not increased in the first stage, stress applied for increasing a threshold voltage can be lessened.

FIG. 21 (*b*) shows an example in which twin cell data is "0".

As a result of without-verify both-cell write in the first step in the first stage, threshold voltage Vth of positive cell MC1 and negative cell MC2 increases. It can be seen that, as a result of reading of twin cell data in the second step of the first stage, twin cell data is "0" and positive cell MC1 is to higher in threshold voltage Vth than negative cell MC2. As a result of with-verify selected cell write in the third step in the first stage, threshold voltage Vth of negative cell MC2 further increases. Consequently, a difference between threshold voltage Vth of positive cell MC1 and threshold voltage Vth of negative cell MC2 decreases. Therefore, in the blank erase state after erase processing, a difference in threshold voltage Vth between positive cell MC1 and negative cell MC2 becomes small and read data has such a value that "0" or "1" randomly fluctuates. Consequently, reading of data "0" held in twin cells before erase of twin cell data can be prevented. Furthermore, since threshold voltage Vth of positive cell MC1 is not increased in the first stage, stress applied for increasing a threshold voltage can be lessened.

The present invention is not limited to the embodiments above, and also includes, for example, a modification as below.

(1) Switching Control

In the embodiments of the present invention, execution of first-stage processing for increasing a threshold voltage of both or one of first storage element 102 and second storage element 103 until the threshold voltage of first storage element 102 and second storage element 103 attains to a prescribed write verify level when a request for erase of twin cell data is received is controlled, however, the present invention is not limited to the processing in the first stage.

For example, a semiconductor device may include both of a function in the first stage and a function of pre-write (without-verify both cell weak write) as described with reference to FIG. 7, and can switch which function is to be executed.

Though the invention made by the present inventor has specifically been described based on the embodiments, the present invention is not limited to the embodiments but can naturally be modified variously within the scope without departing from the gist thereof.

REFERENCE SIGNS LIST

1 microcomputer (MCU); 2 central processing unit (CPU); 3 direct memory access controller (DMAC); 4 bus interface circuit (BIF); 5 random access memory (RAM); 6 flash memory module (FMDL); 7 flash sequencer (FSQC); 8, 9 external input/output port (PRT); 10 timer (TMR); 11 clock pulse generator (CPG); 19, 100 memory array (MARY); 20 sub bit line selector; 22 read column selector; 24 first row decoder (RDEC1); 25 second row decoder (RDEC2); 28 rewrite column selector; 29 input/output circuit (IOBUF); 30 column decoder (CDEC); 31 power supply circuit (VPG); 32 timing generator (TMG); 40 read system discharge circuit; 41 write system discharge circuit; 281, 291 set unit; 82, 92 data input unit; 83, 93 data holding unit; 84, 94 setting unit; 90 erase verify circuit; 100 semiconductor device; 101 memory array; 102 first storage element; 103 second storage element; 104 twin cells; 105 control circuit; 54Pi, 54Ni write latch circuit; P1 to P6 P-channel MOS transistor; N2 to N8, N21, N25 N-channel MOS transistor; IV1 to IV10 inverter; SW1, SW2 switch; VSA_P, VSA_N, ESA_P0 to ESA_PM, ESA_N0 to ESA_NM verify sense amplifier; PVSL, NVSL verify signal line; PSL, NSL signal line; HACSP high-speed access port; LACSP low-speed access port; MC1, MC2 non-volatile memory cell; WMBL main bit line for write; WMBL_0P to WMBL_3P main bit line on positive cell side; WMBL_0N to WMBL_3N main bit line on negative cell side; SBL sub bit line; SBL_0P to SBL_0P sub bit line on positive cell side; SBL_0N to SBL_0N sub bit line on negative cell side; WL word line; MGL memory gate selection line; HBUS high-speed bus; HBUS_D high-speed data bus; PBUS peripheral bus; PBUS_D peripheral data bus; and LG0 to LGM, LGA AND gate.

The invention claimed is:

1. A semiconductor device, comprising:
a memory array which includes a plurality of twin cells holding binary data based on a difference in threshold voltage and constituted of a first storage element and a second storage element, each of which is electrically rewritable; and
a control unit which
controls execution of first-stage processing for increasing a threshold voltage of both or one of the first storage element and the second storage element until the threshold voltage of the first storage element and the threshold voltage of the second storage element attain to a prescribed write verify level when a request for erase of a twin cell data is received, and
controls execution of second-stage processing for lowering both of the threshold voltage of the first storage element and the threshold voltage of the second storage element until the threshold voltage of the first storage element and the threshold voltage of the second storage element attain to a prescribed erase verify level after the first-stage processing is performed.

2. The semiconductor device according to claim 1, further comprising a sense amplifier for verify, wherein
in the first-stage processing, the control unit increases both of the threshold voltage of the first storage element and the threshold voltage of the second storage element and has the sense amplifier for verify compare the threshold voltage of the first storage element and the write verify level with each other and compare the threshold voltage of the second storage element and the write verify level with each other.

3. The semiconductor device according to claim 1, further comprising a sense amplifier for verify, wherein
in the first-stage processing, the control unit carries out control such that processing for increasing both of the threshold voltage of the first storage element and the threshold voltage of the second storage element is performed a prescribed number of times, and thereafter increases the threshold voltage of one predetermined storage element of the first storage element and the second storage element and has the sense amplifier for verify compare the threshold voltage of the one storage element and the write verify level with each other.

4. The semiconductor device according to claim 1, further comprising a sense amplifier for verify, wherein
in the first-stage processing, the control unit carries out control such that processing for reading the twin cell data is performed, and thereafter increases a threshold voltage of a storage element selected in accordance with the read twin cell data of the first storage element and the second storage element and has the sense amplifier for verify compare the threshold voltage of the selected storage element and the write verify level with each other.

5. The semiconductor device according to claim 1, further comprising a sense amplifier for verify, wherein
in the first-stage processing, the control unit carries out control such that processing for increasing both of the threshold voltage of the first storage element and the threshold voltage of the second storage element is performed a prescribed number of times, thereafter carries out control such that processing for reading the twin cell data is performed, and thereafter increases a threshold voltage of a selected storage element in accordance with the read twin cell data of the first storage element and the second storage element and has the sense amplifier for verify compare the threshold voltage of the selected storage element and the write verify level with each other.

6. The semiconductor device according to claim 3, wherein
the control unit controls a voltage applied to the first storage element and the second storage element such that an amount of increase in threshold voltage of a storage element lower in threshold voltage is smaller than in normal write, in the processing for increasing both of the threshold voltage of the first storage element and the threshold voltage of the second storage element which is performed the prescribed number of times.

7. A semiconductor device, comprising:
a memory array which includes a plurality of twin cells holding binary data based on a difference in threshold voltage and constituted of a first storage element and a second storage element, each of which is electrically rewritable; and
a control unit which controls execution of first-stage processing and subsequent second-stage processing when a request for erase of twin cell data is received,
in the first-stage processing, the control unit carrying out control such that processing for increasing both of a threshold voltage of the first storage element and a threshold voltage of the second storage element is performed a prescribed number of times and thereafter carrying out control such that processing for increasing a threshold voltage of one predetermined storage element of the first storage element and the second storage element is performed a prescribed number of times, and
in the second-stage processing, the control unit controlling execution of the second-stage processing for lowering both of the threshold voltage of the first storage element and the threshold voltage of the second storage element until the threshold voltage of the first storage element and the threshold voltage of the second storage element attain to a prescribed erase verify level.

* * * * *